(12) United States Patent
Inamori

(10) Patent No.: US 11,293,818 B2
(45) Date of Patent: Apr. 5, 2022

(54) STRAIN GAUGE AND MULTI-AXIS FORCE SENSOR

(71) Applicant: Minebea Mitsumi Inc., Nagano (JP)

(72) Inventor: Dohaku Inamori, Saku (JP)

(73) Assignee: MINEBEA MITSUMI INC., Nagano (JP)

( * ) Notice: Subject to any disclaimer, the term of this patent is extended or adjusted under 35 U.S.C. 154(b) by 0 days.

(21) Appl. No.: 17/393,937

(22) Filed: Aug. 4, 2021

(65) Prior Publication Data

US 2021/0364374 A1    Nov. 25, 2021

Related U.S. Application Data

(63) Continuation of application No. 16/624,568, filed as application No. PCT/JP2018/025562 on Jul. 5, 2018, now Pat. No. 11,112,319.

(30) Foreign Application Priority Data

| Jul. 6, 2017 | (JP) | ............................. JP2017-132792 |
| Jul. 6, 2017 | (JP) | ............................. JP2017-132793 |
| Jul. 6, 2017 | (JP) | ............................. JP2017-132929 |

(51) Int. Cl.
*G01L 1/22* (2006.01)
*G01L 5/1627* (2020.01)
*G01R 17/10* (2006.01)

(52) U.S. Cl.
CPC ............ *G01L 1/2262* (2013.01); *G01L 1/225* (2013.01); *G01L 5/1627* (2020.01); *G01R 17/10* (2013.01)

(58) Field of Classification Search
CPC ..... G01L 1/2262; G01L 5/1627; G01L 1/225; G01R 17/10
See application file for complete search history.

(56) References Cited

U.S. PATENT DOCUMENTS

| 3,453,873 A | 7/1969 | Lambert |
| 3,665,756 A * | 5/1972 | Russell ................. G01L 1/2281 |
| | | 73/766 |

(Continued)

FOREIGN PATENT DOCUMENTS

| CN | 2274768 Y | 2/1998 |
| CN | 1731115 A | 2/2006 |

(Continued)

OTHER PUBLICATIONS

International Search Report for corresponding International Application No. PCT/JP2018/025562 dated Jul. 31, 2018.

(Continued)

*Primary Examiner* — Max H Noori
(74) *Attorney, Agent, or Firm* — Pearne & Gordon LLP

(57) ABSTRACT

There is provided a flexure body configured to be used in detection of load applied in first direction and a load applied in second direction orthogonal to the first direction. The flexure body including: a flexure member; and a circuit pattern. The flexure member has a flexure area configured to be strained under load from detection object and an area different from the flexure area. The circuit pattern includes two pieces of first-direction strain sensitive elements, two pieces of second-direction strain sensitive elements, and at least one of a first-direction fixed resistance element and a second-direction fixed resistance element. Two pieces of first-direction strain sensitive elements and two pieces of second-direction strain sensitive elements are provided in the flexure area, and the at least one of the first-direction fixed resistance element and the second-direction fixed resistance element is provided in the area different from the flexure area.

9 Claims, 14 Drawing Sheets

(56) References Cited

U.S. PATENT DOCUMENTS

| | | | |
|---|---|---|---|
| 4,086,576 A * | 4/1978 | Jebb | G01G 3/1406 340/440 |
| 4,155,263 A * | 5/1979 | Frantz | G01G 3/145 73/771 |
| 5,850,044 A * | 12/1998 | Spletzer | G01L 5/1627 73/862.041 |
| 7,705,586 B2 | 4/2010 | Van Zon et al. | |
| 7,739,922 B2 | 6/2010 | Inamori | |
| 7,958,782 B2 | 6/2011 | Phan Le | |
| 2002/0104690 A1 * | 8/2002 | Schurr | G01G 3/1412 177/211 |
| 2007/0248892 A1 | 10/2007 | Rangelow | |
| 2008/0116885 A1 | 5/2008 | Van Zon et al. | |
| 2008/0184799 A1 | 8/2008 | Phan Le et al. | |
| 2008/0202241 A1 | 8/2008 | Phan Le | |
| 2008/0258722 A1 | 10/2008 | Zon et al. | |
| 2008/0276726 A1 | 11/2008 | Rey | |
| 2008/0295610 A1 | 12/2008 | Inamori | |
| 2009/0115726 A1 | 5/2009 | Van Zon et al. | |
| 2012/0247220 A1 | 10/2012 | Inamori Dohaku | |
| 2017/0059418 A1 * | 3/2017 | Keller | G01L 1/22 |
| 2018/0143718 A1 | 5/2018 | Kim et al. | |
| 2020/0124486 A1 | 4/2020 | Inamori | |

FOREIGN PATENT DOCUMENTS

| | | |
|---|---|---|
| CN | 1845327 A | 10/2006 |
| CN | 101065676 A | 10/2007 |
| EP | 0 789 234 A1 | 8/1997 |
| JP | H09-43069 A | 2/1997 |
| JP | 2008-298580 A | 12/2008 |
| JP | 2010-164495 A | 7/2010 |
| JP | 4987162 B1 | 7/2012 |
| JP | 5008188 B2 | 8/2012 |
| JP | 6611761 B2 | 11/2019 |
| JP | 6611762 B2 | 11/2019 |
| JP | 6616806 B2 | 12/2019 |
| KR | 960014897 A | 5/1996 |
| KR | 10-2276844 B1 | 7/2021 |

OTHER PUBLICATIONS

Written Opinion for corresponding International Application No. PCT/JP2018/025562 dated Jul. 31, 2018.

English translation of Written Opinion for International Application No. PCT/JP2018/025562, dated Jul. 31, 2018.

Notice of Reasons for Refusal dated Sep. 8, 2020 for corresponding Japanese Application No. 2019-177655 and English translation.

Notice of Reasons for Refusal dated Sep. 8, 2020 for corresponding Japanese Application No. 2019-202891 and English translation.

Decision to Grant a patent dated Sep. 8, 2020 for corresponding Japanese Application No. 2019-195921 and English translation.

Extended European Search Report dated Feb. 2, 2021 for corresponding European Patent Application No. 18827803.0.

Notice of Allowance dated Mar. 8, 2021 for corresponding Korean Application No. 10-2019-7036389 and English translation.

Notice of Allowance dated Apr. 20, 2021 for corresponding Korean Divisional Patent Application No. 10-2021-7010752 and English translation.

Decision to Grant a Patent dated Jan. 26, 2021 for related Japanese Application No. 2019-177655 (now JP Patent 6837113) and English translation.

First Office Action dated Mar. 24, 2021 for corresponding Chinese Patent Application No. 201880037802.6 and English translation.

Chinese Office Action dated Sep. 15, 2021 for corresponding Chinese Application No. 201880037802.6 and English translation.

European Office Action dated Nov. 29, 2021 for corresponding European Application No. 18827803.0.

Chinese Decision of Rejection dated Feb. 7, 2022 for corresponding Chinese Application No. 201880037802.6 and English translation.

* cited by examiner

STRAIN GAUGE AND MULTI-AXIS FORCE SENSOR

CROSS REFERENCE TO RELATED APPLICATION

The present application is a Continuation of U.S. application Ser. No. 16/624,568 filed on Dec. 19, 2019, which is a 371 of PCT/JP2018/025562 filed on Jul. 5, 2018, which claims priority to Japanese Application Nos. 2017-132792, 2017-132929 and 2017-132793 all filed on Jul. 6, 2017, the disclosures of which are incorporated herein by reference in its entirety.

TECHNICAL FIELD

The present invention relates to a strain gage and a multi-axis (multiaxial, multiple axis) force sensor including the strain gage.

BACKGROUND ART

Multi-axis force sensors including a strain gage are widely utilized in robots, game devices, various measuring devices, and other devices. Patent Literatures 1 and 2 disclose examples of multi-axis force sensors including a strain gage.

CITATION LIST

Patent Literature 1: Japanese Patent Application Laid-open No. 2010-164495
Patent Literature 2: Japanese Patent No. 5,008,188, publication

SUMMARY

Technical Problem

A multi-axis force sensor including a strain gage is recognized to have (involve) a measurement error due to a change in ambient temperature. Hence, it is desired to suppress such an error.

Accordingly, an object of the present invention is to provide a strain gage wherein a measuring error due to a change in ambient temperature is suppressed, and a multi-axis force sensor including the strain gage.

Solution to the Problem

According to a first aspect of the present invention, there is provided a strain gage configured to be attached to a flexure member so as to be used in a detection of a load applied to the flexure member in a first direction with a first Wheatstone bridge circuit and a detection of a load applied to the flexure member in a second direction orthogonal to the first direction with a second Wheatstone bridge circuit, the flexure member being configured to be strained under a load, the strain gage including:
  a base member; and
  a circuit pattern formed on the base member,
  wherein the base member has a sensitive area configured to be attached to a flexure area of the flexure member and a non-sensitive area configured to be arranged outside of the flexure area, the flexure area being configured to be strained under the load;
  the circuit pattern includes two pieces of first-direction strain sensitive elements configured to construct the first Wheatstone bridge circuit, two pieces of second-direction strain sensitive elements configured to construct the second Wheatstone bridge circuit, and at least one of a first-direction fixed resistance element configured to construct the first Wheatstone bridge circuit and a second-direction fixed resistance element configured to construct the second Wheatstone bridge circuit;
  the two pieces of first-direction strain sensitive elements, the two pieces of second-direction strain sensitive elements, and the at least one of the first-direction fixed resistance element and the second-direction fixed resistance element are formed of a same material; and
  the two pieces of first-direction strain sensitive elements and the two pieces of second-direction strain sensitive elements are formed in the sensitive area, and the at least one of the first-direction fixed resistance element and the second-direction fixed resistance element is formed in the non-sensitive area.

According to a second aspect of the present invention, there is provided a strain gage configured to be attached to a flexure member so as to be used in a detection of a load applied to the flexure member in a first direction with a first Wheatstone bridge circuit and detect a load applied to the flexure member in a second direction orthogonal to the first direction with a second Wheatstone bridge circuit, the flexure member being configured to be strained under a load, the strain gage including:
  a base member having a flexibility; and
  a circuit pattern formed on the base member,
  wherein the base member has a sensitive area configured to be attached to a flexure area of the flexure member, a non-sensitive area configured to be arranged outside of the flexure area, and a connecting area configured to connect the sensitive area and the non-sensitive area, the flexure area being configured to be strained under the load;
  a size of the connection area in an orthogonal direction is smaller than sizes of the sensitive area and the non-sensitive area in the orthogonal direction, the orthogonal direction being orthogonal to a direction along which the sensitive area and the non-sensitive area are connected;
  the circuit pattern includes two pieces of first-direction strain sensitive elements configured to construct the first Wheatstone bridge circuit, two pieces of second-direction strain sensitive elements configured to construct the second Wheatstone bridge circuit, and at least one of a first-direction fixed resistance element configured to construct the first Wheatstone bridge circuit and a second-direction fixed resistance element configured to construct the second Wheatstone bridge circuit;
  the two pieces of first-direction strain sensitive elements, the two pieces of second-direction strain sensitive elements, and the at least one of the first-direction fixed resistance element and the second-direction fixed resistance element are formed of a same material;
  the two pieces of first-direction strain sensitive elements and the two pieces of second-direction strain sensitive elements are formed in the sensitive area; and
  the at least one of the first-direction fixed resistance element and the second-direction fixed resistance element is formed in the non-sensitive area.

In the strain gage according to the first and second aspects, the circuit pattern may include two pieces of first-direction fixed resistance elements configured to construct the first Wheatstone bridge circuit and two pieces of second-direction fixed resistance elements configured to construct the second Wheatstone bridge circuit;

the two pieces of first-direction strain sensitive elements, the two pieces of second-direction strain sensitive elements, the two pieces of first-direction fixed resistance elements and the two pieces of second-direction fixed resistance elements may be formed of the same material; and the two pieces of first-direction fixed resistance elements and the two pieces of second-direction fixed resistance elements may be formed in the non-sensitive area.

In the strain gage according to the first and second aspects, the circuit pattern may further include at least one terminal that may be formed in the non-sensitive area.

In the strain gage according to the first and second aspects, in the non-sensitive area, the at least one terminal may be provided on an opposite side of the at least one of the first-direction fixed resistance element and the second-direction fixed resistance element from the sensitive area.

In the strain gage according to the first and second aspects, the non-sensitive area may be a pair of areas provided on both sides of the sensitive area.

In the strain gage according to the first and second aspects, the circuit pattern may further include two pieces of third-direction strain sensitive elements or two pieces of third-direction fixed resistance elements; and the two pieces of third-direction strain sensitive elements or the two pieces of third-direction fixed resistance elements may be configured to connect the first and second Wheatstone bridge circuits so as to construct a third Wheatstone bridge circuit.

In the strain gage according to the first aspect, the base member may have flexibility;

the base member may further have a connecting area configured to connect the sensitive area and the non-sensitive area; and a size of the connecting area in an orthogonal direction may be smaller than sizes of the sensitive area and the non-sensitive area in the orthogonal direction, the orthogonal direction being orthogonal to a direction along which the sensitive area and the non-sensitive area are connected.

The strain gage according to the first aspect may be further configured to be used in a detection of a load applied to the flexure member in a third direction orthogonal to the first and second directions with a third Wheatstone bridge circuit.

Further, in the strain gage according to the first aspect, the base member may have flexibility;

the non-sensitive area of the base member may be a pair of areas;

the base member may further have a connecting area configured to connect the sensitive area and the non-sensitive area;

a size of the connecting area in an orthogonal direction may be smaller than sizes of the sensitive area and the non-sensitive area in the orthogonal direction, the orthogonal direction being orthogonal to a direction along which the sensitive area and the non-sensitive area are connected;

the circuit pattern may include two pieces of third-direction strain sensitive elements which is formed in the sensitive area and which is configured to construct the third Wheatstone bridge circuit, two pieces of first-direction fixed resistance elements which is formed in the non-sensitive area and which is configured to construct the first Wheatstone bridge circuit, and two pieces of second-direction fixed resistance elements which is formed in the non-sensitive area and which is configured to construct the second Wheatstone bridge circuit;

the two pieces of first-direction strain sensitive elements, the two pieces of second-direction strain sensitive elements, the two pieces of third-direction strain sensitive elements, the two pieces of first-direction fixed resistance elements and the two pieces of second-direction fixed resistance elements may be formed of the same material; and the two pieces of third-direction strain sensitive elements may be configured to connect the first and second Wheatstone bridge circuits so as to construct the third Wheatstone bridge circuit.

According to a third aspect of the present invention, there is provided a multi-axis force sensor including:

a flexure plate;

a load receiving part connected to the flexure plate; and the strain gage of the first or second aspect attached to the flexure plate.

In the multiaxial force sensor according to the third aspect, the non-sensitive area of the base member of the strain gage may be attached to a side surface of the flexure plate.

According to a fourth aspect of the present invention, there is provided a strain gage configured to be attached to a flexure member so as to be used in a detection of a load applied to the flexure member in a first direction with a first Wheatstone bridge circuit, a detection of a load applied to the flexure member in a second direction orthogonal to the first direction with a second Wheatstone bridge circuit and, a detection of a load applied to the flexure member in a third direction orthogonal to the first and second directions with a third Wheatstone bridge circuit, the flexure member being configured to be strained under a load, the strain gage including:

a base member having a flexibility; and a circuit pattern formed on the base member, wherein the base member has a sensitive area configured to be attached to a flexure area of the flexure member and a pair of non-sensitive areas configured to be arranged outside of the flexure area, and a connection area configured to connect the sensitive area and the non-sensitive area, the flexure area being configured to be strained under the load;

a size of the connection area in an orthogonal direction is smaller than sizes of the sensitive area and the non-sensitive area in the orthogonal direction, the orthogonal direction being orthogonal to a direction along which the sensitive area and the non-sensitive area are connected;

the circuit pattern includes two pieces of first-direction strain sensitive elements configured to construct the first Wheatstone bridge circuit, two pieces of second-direction strain sensitive elements configured to construct the second Wheatstone bridge circuit, two pieces of third-direction strain sensitive elements configured to construct the third Wheatstone bridge circuit, two pieces of first-direction fixed resistance elements configured to construct the first Wheatstone bridge circuit, and two pieces of second-direction fixed resistance elements configured to construct the second Wheatstone bridge circuit;

the first-direction strain sensitive element, the second-direction strain sensitive element, the third-direction strain sensitive element, the first-direction fixed resistance element and the second-direction fixed resistance element are formed of a same material;

the first-direction strain sensitive element, the second-direction strain sensitive element and the third-direction strain sensitive element are formed in the sensitive area;

the first-direction fixed resistance element and the second-direction fixed resistance element are formed in the non-sensitive area; and the third-direction strain sensitive element is configured to connect the first and second Wheatstone bridge circuits so as to construct the third Wheatstone bridge circuit.

According to a fifth aspect of the present invention, there is provided a triaxial force sensor including:

the strain gage of the fourth aspect;

the flexure member having a plate-shape; and a load receiving part connected to the flexure member.

The triaxial force sensor according to the fifth aspect may further includes a peripheral wall which upstands from a circumferential edge of a first surface of the flexure member in the third direction, the first surface being opposite to a second surface of the flexure member to which the load receiving part is connected, and wherein the non-sensitive area may be attached to an inner circumferential surface of the peripheral wall.

Effect of the Invention

In the strain gage and the multi-axis force sensor including the strain gage according to the present invention, any occurrence of a measuring error due to the change in ambient temperature is suppressed.

DESCRIPTION OF EMBODIMENTS

First Embodiment

An explanation will be given about a strain gage and a multi-axis force sensor of a first embodiment of the present invention, referring to a strain gage 120 and a triaxial force sensor 1000 to which the strain gage 120 is applied as examples thereof, with reference to FIGS. 1 to 4.

Figure 1:
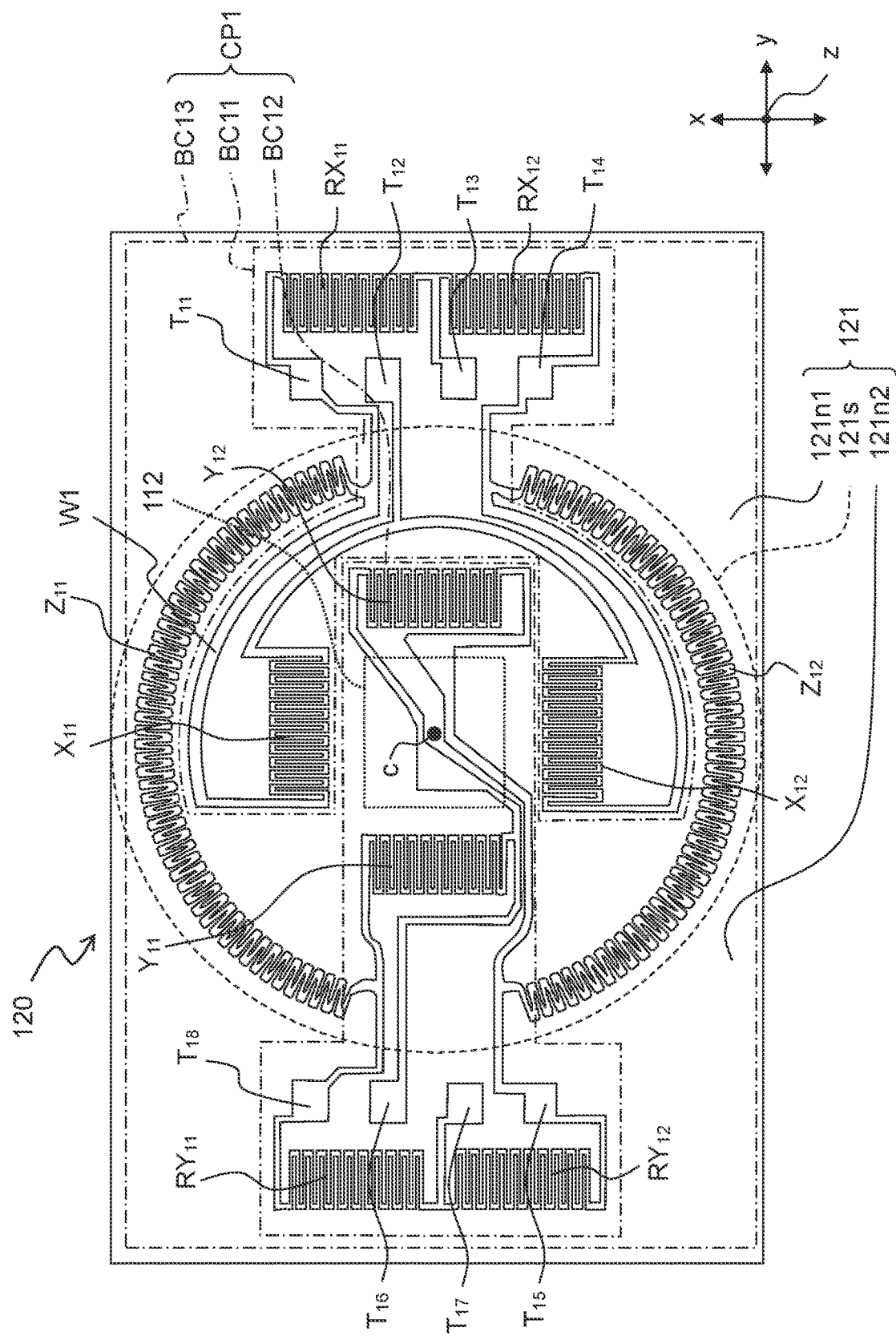
FIG. 1 depicts a wiring pattern of a strain gage according to a first embodiment of the present invention.

FIG. 1 depicts a state before the strain gage 120 is provided on or attached to a flexure plate (a strain plate) 111 of the triaxial force sensor 1000 (see FIGS. 3(a) and 3(b)). As depicted in FIG. 1, the strain gage 120 includes a rectangular base member (base material) 121, and a circuit pattern CP1 printed on a surface of the base member 121. The base member 121 has a sensitive area 121s, and non-sensitive areas 121n1 and 121n2 interposing or sandwiching the sensitive area 121s therebetween. The circuit pattern CP1 includes six strain sensitive elements $X_{11}$, $X_{12}$, $Y_{11}$, $Y_{12}$, $Z_{11}$, and $Z_{12}$, four fixed resistance elements $RX_{11}$, $RX_{12}$, $RY_{11}$, and $RY_{12}$, eight terminals $T_{11}$ to $T_{18}$, and a wire W1 connecting those elements (members). Note that in the explanation of the first embodiment, in the strain gage 120 and the triaxial force sensor 1000 including the strain gage 120, a direction y (second direction) refers to a direction in which the non-sensitive areas 121n1 and 121n2 sandwich the sensitive area 121s therebetween, whereas a direction x (first direction) refers to a direction orthogonal to the direction y on the surface of the base member 121. Further, a direction z (third direction) refers to the direction of an axis orthogonal to the direction x and the direction y.

Here, in the triaxial force sensor 1000 depicted in FIGS. 3(a) and 3(b), the flexure plate 111 is shaped in a circular plate or a disc which is strained (distorted) in a case of receiving, via a load receiving part (a load applied part) 112, a load applied from outside onto the triaxial force sensor 1000. The strain of the flexure plate 111 is generated or arises on the front and back surfaces of the flexure plate 111 (the upper and lower surfaces orthogonal to the direction z), but does not arise or is small enough to be neglectable on the lateral surface of the flexure plate 111 (the circumferential surface parallel to the direction z). In this specification, the term "flexure area (strain area)" is used to refer to an area, in the flexure plate 111, which is strained by receiving an external load, such as the front and back surfaces of the flexure plate 111 in the first embodiment. The diameter and the thickness of the flexure plate 111 is arbitrary.

The load receiving part 112 upstands, from a central part of the front surface of the flexure plate 111, in a direction of a rotating axis A1 of the flexure plate 111 (in the direction z). The load receiving part 112 is a part which receives a load from outside and thereby moves so as to generate a strain in the flexure plate 111, and which is, for example, a prism (square rod) having a square-shaped cross section. The load receiving part 112 is provided on the front surface of the flexure plate 111 such that the central axis of the prism is coincident with the rotating axis A1 of the flexure plate 111, namely coaxially with the flexure plate 111. The flexure plate 111 and the load receiving part 112 are integrally formed, for example, of a synthetic resin material.

Returning to FIG. 1, the base member 121 is, for example, a flexible resin film and has the sensitive area 121s which is circular and which is arranged in the center of the base member 121, and a pair of non-sensitive areas 121n1 and 121n2 sandwiching the sensitive area 121s therebetween. It is possible to use polyester, polyimide, etc., as the resin film. Further, although it is also possible to form the sensitive area 121s and the non-sensitive areas 121n1 and 121n2 with mutually different materials, it is desirable to form them with a same material such that the temperature property (temperature coefficient of resistance (resistance temperature coefficient), etc.) is uniform across all the areas. Further, in such a case, it is also desirable to form the base member 121 by integrally cutting out the sensitive area 121s and the non-sensitive areas 121n1 and 121n2 from vicinal parts of an integrally formed material (for example, a sheet of polyester, polyimide, etc.). By virtue of this, it is possible to further uniformize the temperature properties of the respective areas.

Since the sensitive area 121s is an area to be attached or adhered to the back surface of the flexure plate 111, the sensitive area 121s has a diameter equivalent to or smaller than that of the back surface of the flexure plate 111. On one surface of the sensitive area 121s, there are formed the strain sensitive elements $X_{11}$ and $X_{12}$ (first-direction strain sensitive elements) with a center c being sandwiched therebetween in the direction x, the strain sensitive elements $Y_{11}$ and $Y_{12}$ (second-direction strain sensitive elements) with the center c being sandwiched therebetween in the direction y, and the strain sensitive elements $Z_{11}$ and $Z_{12}$ (third-direction strain sensitive elements) along the outer circumference of the sensitive area 121s.

The strain sensitive elements $X_{11}$ and $X_{12}$ are formed parallel to each other, with the direction y as the width direction of grid thereof, respectively. The strain sensitive element $X_{11}$ and the strain sensitive element $X_{12}$ are formed at positions equidistant from the center c respectively (a distance between the center c and the strain sensitive element $X_{11}$ and the distance between the center c and the strain sensitive element $X_{12}$ are identical). The distance in the direction x between the strain sensitive element $X_{11}$ and the strain sensitive element $X_{12}$ is greater than the width in the direction x of the load receiving part 112.

The strain sensitive elements $Y_{11}$ and $Y_{12}$ are formed parallel to each other, with the direction x as the width direction of grid thereof, respectively. The strain sensitive element $Y_{11}$ and the strain sensitive element $Y_{12}$ are formed at positions equidistant from the center c respectively (a distance between the center c and the strain sensitive element $Y_{11}$ and the distance between the center c and the strain sensitive element $Y_{12}$ are identical). The distance in the direction y between the strain sensitive element $Y_{11}$ and the strain sensitive element $Y_{12}$ is greater than the width in the direction y of the load receiving part 112.

The strain sensitive elements $Z_{11}$ and $Z_{12}$ have arc-like shapes respectively and are formed to face each other in the direction x, with the circumferential direction of the sensitive area 121s as the width direction of grid thereof. The strain sensitive elements $Z_{11}$ and $Z_{12}$ are arranged on an opposite side, of the strain sensitive elements $X_{11}$, $X_{12}$, $Y_{11}$, and $Y_{12}$, from the center c (outside of the strain sensitive elements $X_{11}$, $X_{12}$, $Y_{11}$, and $Y_{12}$).

The pair of non-sensitive areas 121n1 and 121n2 are shaped to interpose the sensitive area 121s therebetween in the direction y.

Fixed resistance elements $RX_{11}$ and $RX_{12}$ (first-direction fixed resistance elements) are formed in an area (a part), of the surface of the non-sensitive area 121n1, far from the sensitive area 121s, so that each of the fixed resistance elements $RX_{11}$ and $RX_{12}$ extends in the direction x and that the fixed resistance elements $RX_{11}$ and $RX_{12}$ are aligned in the direction x. Four terminals $T_{11}$, $T_{12}$, $T_{13}$, and $T_{14}$ are formed in an area (a part), of the surface of the non-sensitive area 121n1, close to the sensitive area 121s, so that the terminals $T_{11}$, $T_{12}$, $T_{13}$ and $T_{14}$ are aligned in the direction x. Namely, in the non-sensitive area 121n1, the fixed resistance elements $RX_{11}$ and $RX_{12}$ are arranged on an opposite side of the terminals $T_{11}$ to $T_{14}$ from the sensitive area 121s.

Similarly, fixed resistance elements $RY_{11}$ and $RY_{12}$ (second-direction fixed resistance elements) are formed in an area (a part), of the surface of the non-sensitive area 121n2, far from the sensitive area 121s, so that each of the fixed resistance elements $RY_{11}$ and $RY_{12}$ extends in the direction x and that the fixed resistance elements $RY_{11}$ and $RY_{12}$ are aligned in the direction x. Four terminals $T_{15}$, $T_{16}$, $T_{17}$, and $T_{18}$ are formed in an area (a part), of the surface of the non-sensitive area 121n2, close to the sensitive area 121s, so that the terminals $T_{15}$, $T_{16}$, $T_{17}$ and $T_{18}$ are aligned in the direction x. Namely, in the non-sensitive area 121n2, the fixed resistance elements $RY_{11}$ and $RY_{12}$ are arranged on an opposite side of the terminals $T_{15}$ to $T_{18}$ from the sensitive area 121s.

Figure 2:
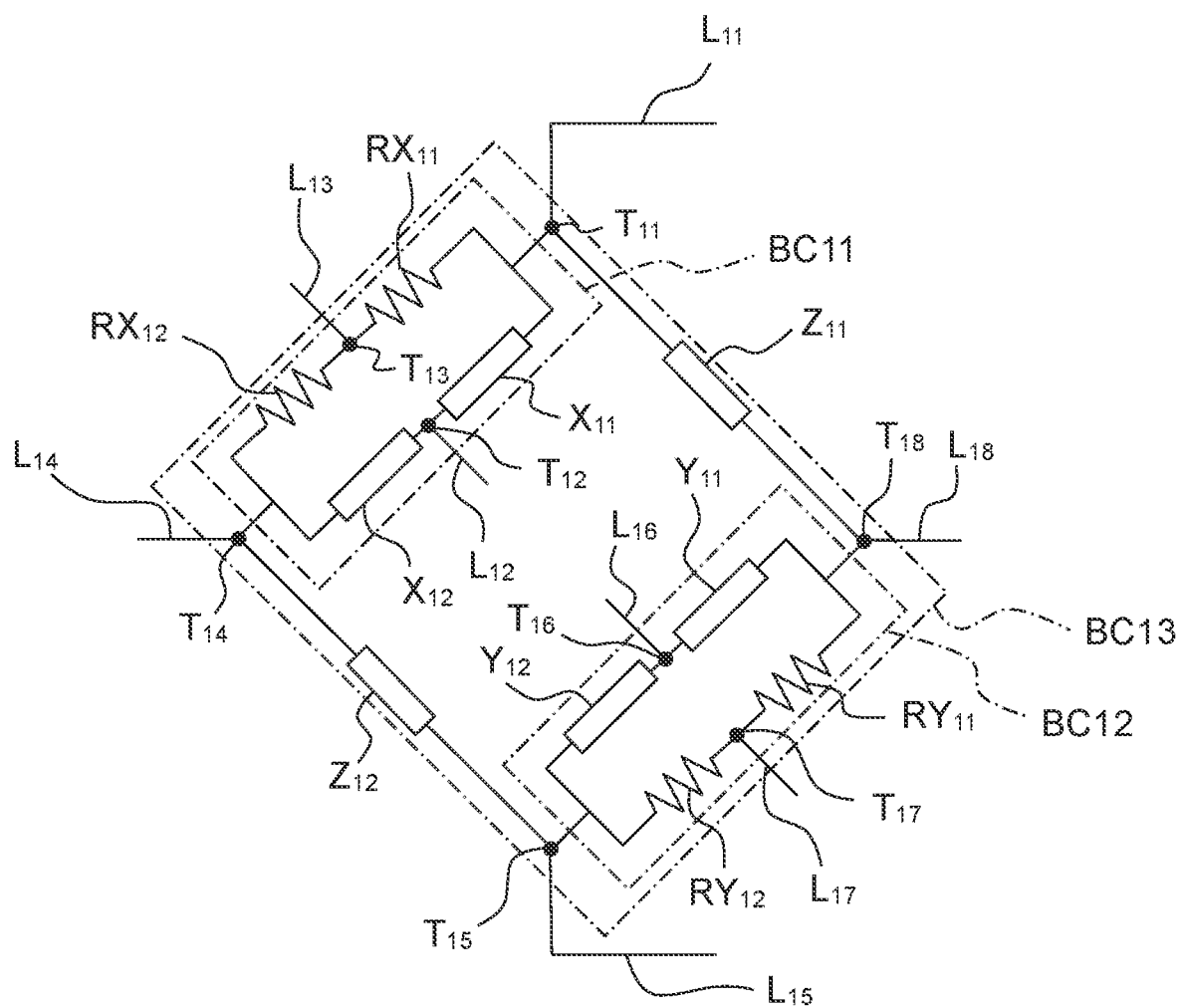
FIG. 2 is a circuit diagram corresponding to the wiring pattern of the strain gage of FIG. 1.
Figure 3:
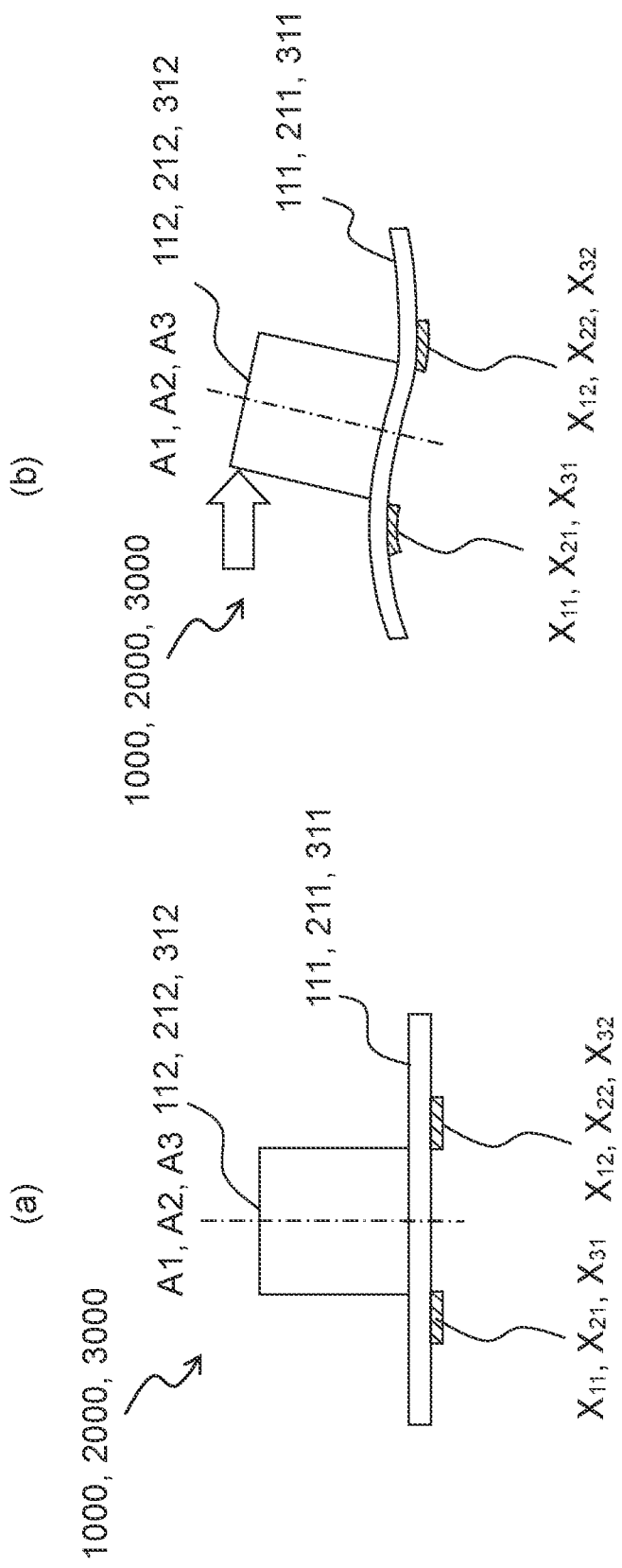
FIGS. 3(a) and 3(b) are illustrative views depicting a situation of measurement performed with a triaxial force sensor according to each embodiment of the present invention.

As shown in FIGS. 1 and 2, the wire W1 connects the strain sensitive elements $X_{11}$ and $X_{12}$, and the fixed resistance elements $RX_{11}$ and $RX_{12}$ to construct a first bridge circuit BC11 (first Wheatstone bridge circuit). The terminal $T_{11}$ is connected between the strain sensitive element $X_{11}$ and the fixed resistance element $RX_{11}$, the terminal $T_{12}$ is connected between the strain sensitive elements $X_{11}$ and $X_{12}$, the terminal $T_{13}$ is connected between the fixed resistance elements $RX_{11}$ and $RX_{12}$, and the terminal $T_{14}$ is connected between the strain sensitive element $X_{12}$ and the fixed resistance element $RX_{12}$.

Similarly, the wire W1 connects the strain sensitive elements $Y_{11}$ and $Y_{12}$, and the fixed resistance elements $RY_{11}$ and $RY_{12}$ to construct a second bridge circuit BC12 (second Wheatstone bridge circuit). The terminal $T_{18}$ is connected between the strain sensitive element $Y_{11}$ and the fixed resistance element $RY_{11}$, the terminal $T_{16}$ is connected between the strain sensitive elements $Y_{11}$ and $Y_{12}$, the terminal $T_{17}$ is connected between the fixed resistance elements $RY_{11}$ and $RY_{12}$, and the terminal $T_{15}$ is connected between the strain sensitive element $Y_{12}$ and the fixed resistance element $RY_{12}$.

One end of the strain sensitive element $Z_{11}$ is connected to the first bridge circuit BC11 between the strain sensitive element $X_{11}$ and the fixed resistance element $RX_{11}$, whereas the other end of the strain sensitive element $Z_{11}$ is connected to the second bridge circuit BC12 between the strain sensitive element $Y_{11}$ and the fixed resistance element $RY_{11}$. Similarly, one end of the strain sensitive element $Z_{12}$ is connected to the first bridge circuit BC11 between the strain sensitive element $X_{12}$ and the fixed resistance element $RX_{12}$, whereas the other end of the strain sensitive element $Z_{12}$ is connected to the second bridge circuit BC12 between the strain sensitive element $Y_{12}$ and the fixed resistance element $RY_{12}$. By virtue of this, a third bridge circuit BC13 (third Wheatstone bridge circuit) is constructed with the first bridge circuit BC11 and the second bridge circuit BC12 on one pair of opposite sides respectively, and with the strain sensitive elements $Z_{11}$ and $Z_{12}$ on the other pair of opposite sides respectively.

The strain sensitive elements $X_{11}$, $X_{12}$, $Y_{11}$, $Y_{12}$, $Z_{11}$, and $Z_{12}$; the fixed resistance elements $RX_{11}$, $RX_{12}$, $RY_{11}$, and $RY_{12}$; and the wire W1 included in the circuit pattern CP1 are formed from the same material, or preferably formed from vicinal parts in one material. This material is, for example, copper, a copper alloy such as copper nickel or the like, etc. It is possible to carry out the print of the circuit pattern CP1 on the base member 121 by way of photoetching, printing, evaporation, sputtering, etc.

The strain gage 120 is attached to the flexure plate 111 such that the surface of the base member 121, on a side opposite to the surface of the base member 121 formed with the circuit pattern CP1, is in contact with the flexure plate 111.

Specifically, the sensitive area 121s of the base member 121 is attached to the back surface of the flexure plate 111 such that the center c is coincident with the rotating axis A1 of the flexure plate 111. Note that as described above, the distance in the direction x between the strain sensitive elements $X_{11}$ and $X_{12}$ is greater than the size in the direction x of the load receiving part 112, whereas the distance in the direction y between the strain sensitive elements $Y_{11}$ and $Y_{12}$ is greater than the size in the direction y of the load receiving part 112. Therefore, in a state that the sensitive area 121s of the base member 121 is attached to the flexure plate 111, the strain sensitive elements $X_{11}$ and $X_{12}$ and the strain sensitive elements $Y_{11}$ and $Y_{12}$ are respectively arranged in areas which are arranged on the outside of the load receiving part 112 in the direction x and/or the direction y and in each of which a comparatively large strain is generated. Note that in FIGS. 1 and 4, a dotted line depicts the outline of the load receiving part 112 in the state that the base member 121 is attached to the flexure plate 111, thereby showing a positional relationship between the load receiving part 112 and the strain sensitive elements $X_{11}$, $X_{12}$, $Y_{11}$, and $Y_{12}$.

In the base member 121 attached to the triaxial force sensor 1000, the terminals $T_{11}$, $T_{12}$, $T_{13}$, and $T_{14}$ formed in the non-sensitive area 121n1 and the terminals $T_{15}$, $T_{16}$, $T_{17}$, and $T_{18}$ formed in the non-sensitive area 121n2 are exposed to the outside in the radial direction of the flexure plate 111 (namely, the outside of the flexure area).

Next, an explanation will be made on a method for using the strain gage 120 and the triaxial force sensor 1000 according to the first embodiment, and an operation thereof.

In a case that the triaxial force sensor 1000 is used, for example, as a tactile sensor of a robot hand, the triaxial force sensor 1000 is firstly fixed with respect to a fingertip of the robot hand. Next, the terminals $T_{11}$-$T_{18}$ are connected to a signal processing unit (not shown) respectively by using lead wires $L_{11}$-$L_{18}$ (FIG. 2). It is possible to connect or join the terminals $T_{11}$-$T_{18}$ and the lead wires $L_{11}$-$L_{18}$ by an arbitrary method. For example, it is possible to use a solder or an anisotropic conductive film (ACF) therefor.

The terminals $T_{11}$ and $T_{15}$ are connected, with the lead wires $L_{11}$ and $L_{15}$, respectively, to the power source (not shown) of the signal processing unit. The terminals $T_{12}$ and $T_{13}$, the terminals $T_{16}$ and $T_{17}$ and the terminals $T_{14}$ and $T_{18}$ are connected, with the lead wires $L_{12}$ and $L_{13}$, the lead wires $L_{16}$ and $L_{17}$ and the lead wires $L_{14}$ and $L_{18}$, respectively, to a calculating unit (not shown) in the signal processing unit via an amplifier (not shown) in the signal processing unit.

In a case that the triaxial force sensor 1000 is operating, an input voltage Ei is applied between the terminal $T_{11}$ and the terminal $T_{15}$ by the power source. The resistance value of each of the strain sensitive elements constructing the first bridge circuit BC11, the second bridge circuit BC12 and the third bridge circuit BC13 and the resistance value of each of the fixed resistance elements constructing the first bridge circuit BC11, the second bridge circuit BC12 and the third bridge circuit BC13 have been adjusted so that the voltages are equal or uniform between the terminals $T_{12}$ and $T_{13}$, that the voltages are equal between the terminals $T_{16}$ and $T_{17}$, and that the voltages are equal between the terminals $T_{14}$ and $T_{18}$, in a state that the sensitive area 121s of the base member 121 has no flexure. Therefore, in a state that the flexure plate 111 has no strain and thus the sensitive area 121s has no flexure (FIG. 3(a)), there is no potential difference (difference in potential) between the terminals $T_{12}$ and $T_{13}$, between the terminals $T_{16}$ and $T_{17}$, and between the terminals $T_{14}$ and $T_{18}$, and thus the calculating unit does not calculate the strain.

Next, in a case that a load in the direction x is applied to the load receiving part 112, the load receiving part 112 receives the load and thus moves to cause a strain to be generated in the flexure plate 111 (FIG. 3(b)). On this occasion, the sensitive area 121s of the base member 121 of the strain gage 120 attached to the flexure plate 111 also flexes integrally with the flexure plate 111, so as to cause a compressive strain to be generated in the strain sensitive element $X_{11}$ and to cause a tensile strain (an elongation strain) to be generated in the strain sensitive element $X_{12}$. By virtue of this, each of the resistance values of the strain sensitive elements $X_{11}$ and $X_{12}$ is changed to thereby generate a potential difference between the terminals $T_{12}$ and $T_{13}$ of the first bridge circuit BC11 including the strain sensitive elements $X_{11}$ and $X_{12}$. Based on this potential difference, the calculating unit obtains an amount of the strain generated in the flexure plate 111 so as to obtain magnitude of the load in the direction x acting on the load receiving part 112. Note that on this occasion, no strain is generated on the outside of the flexure area, namely, in the non-sensitive areas 121n1 and 121n2, due to which the resistance values of the fixed resistance elements $RX_{11}$ and $RX_{12}$ are constant. Also in a case that a load in the direction y is applied to the load receiving part 112, the magnitude of the load in the direction y acting on the load receiving part 112 is obtained in a similar manner as described above.

In a case that a load in the direction Z is applied to the load receiving part 112, tensile strains are generated in all of the strain sensitive elements $X_{11}$, $X_{12}$, $Y_{11}$, $Y_{12}$, $Z_{11}$, and $Z_{12}$ since the flexure plate 111 and the sensitive area 121s of the base member 121 are curved such that the centers thereof are projected. By virtue of this, each of the combined resistance of the first bridge circuit BC11, the combined resistance of the second bridge circuit BC12, and the resistance values of the strain sensitive elements $Z_{11}$ and $Z_{12}$ are changed to thereby generate a potential difference between the terminals $T_{14}$ and $T_{18}$ of the third bridge circuit BC13. Based on this potential difference, the calculating unit obtains the amount of the strain generated in the flexure plate 111 so as to obtain the magnitude of the load in the direction Z acting on the load receiving part 112.

Hereinbelow, an explanation will be given on the significance of printing, on the base member 121, the fixed resistance elements $RX_{11}$ and $RX_{12}$ of the first bridge circuit BC11 and the fixed resistance elements $RY_{11}$ and $RY_{12}$ of the second bridge circuit BC12, and of forming the fixed resistance elements $RX_{11}$ and $RX_{12}$ of the first bridge circuit BC11 and the fixed resistance elements $RY_{11}$ and $RY_{12}$ of the second bridge circuit BC12 with a same material as that forming the strain sensitive elements $X_{11}$, $X_{12}$, $Y_{11}$, and $Y_{12}$.

(1-1) By forming the fixed resistance elements $RX_{11}$, $RX_{12}$, $RY_{11}$, and $RY_{12}$ in the above-described manner, the fixed resistance elements $RX_{11}$, $RX_{12}$, $RY_{11}$, and $RY_{12}$ are formed from the same material as the strain sensitive elements $X_{11}$, $X_{12}$, $Y_{11}$, $Y_{12}$, $Z_{11}$, and $Z_{12}$, and at the positions in the vicinity thereof. Here, the temperature coefficient of resistance indicating a change ratio of the resistance value with respect to the change in the temperature (temperature change) is a physical property value depending on the material; therefore, in the first embodiment, the temperature coefficient of resistance is equal among all the strain sensitive elements and all the fixed resistance elements. Further, since the fixed resistance elements $RX_{11}$, $RX_{12}$, $RY_{11}$, and $RY_{12}$ are formed on the base member 121 and thus at the locations in the vicinity of the strain sensitive elements $X_{11}$, $X_{12}$, $Y_{11}$, $Y_{12}$, $Z_{11}$ and $Z_{12}$, the changes in the ambient temperature each affecting each of the strain sensitive elements or each of the fixed resistance elements are substantially the same. Therefore, in a case that any change arises in the ambient temperature, the resistance values of all the strain sensitive elements and the resistance values of all the fixed resistance elements change at a same ratio.

In each of the first bridge circuit BC11, the second bridge circuit BC12 and the third bridge circuit BC13, in a case that the balance of the resistance values changes between the resistance elements (the strain sensitive elements and the fixed resistance elements) included therein, then any potential differences arise between the terminals $T_{12}$ and $T_{13}$, between terminals $T_{16}$ and $T_{17}$, and between the terminals $T_{14}$ and $T_{18}$, based on which strains are detected. Therefore, in a case that the balance changes between the resistance values of the strain sensitive elements and the resistance values of the fixed resistance elements due to a change in ambient temperature, any measuring error might be generated due to this change in the balance. In the first embodiment, however, in a case that the ambient temperature changes, the resistance values of all the strain sensitive elements and the resistance values of all the fixed resistance elements change at the same ratio. Therefore, even in a case that the ambient temperature changes, the balance of the resistance values does not change between the respective elements, thereby suppressing the measuring error from occurring. Note that in the formation of the circuit pattern CP1, in a case that vicinal parts of the material (copper, a copper alloy, etc.) prepared as an integral block are used to form the strain sensitive elements, etc., it is possible to make the temperature coefficients of resistance of the strain sensitive elements $X_{11}$, $X_{12}$, $Y_{11}$, $Y_{12}$, $Z_{11}$, and $Z_{12}$, the fixed resistance elements $RX_{11}$, $RX_{12}$, $RY_{11}$, and $RY_{12}$, and the wire W1 to be further uniform, thereby making it possible to more satisfactorily suppress the occurrence of the measuring error.

(1-2) As in the first embodiment, it is possible to form the fixed resistance elements $RX_{11}$ and $RX_{12}$ of the first bridge circuit BC11 and the fixed resistance elements $RY_{11}$ and $RY_{12}$ of the second bridge circuit BC12 in the non-sensitive areas 121n1 and 121n2 of the base member 121, and to thereby cause the fixed resistance elements $RX_{11}$, $RX_{12}$, $RY_{11}$, and $RY_{12}$ to function as dummy gages for the purpose of temperature compensation in the part in which no strain is generated (the part on the outside of the flexure area). Therefore, even in a case that any expansion or contraction is generated in the main body part of the triaxial force sensor 1000 including the flexure plate 111 due to any change in the ambient temperature, it is also possible to suppress the occurrence of a measuring error by compensating the change in the resistance values of the strain sensitive elements $X_{11}$, $X_{12}$, $Y_{11}$, and $Y_{12}$ due to the expansion or the contraction.

(1-3) By printing and forming the fixed resistance elements $RX_{11}$, $RX_{12}$, $RY_{11}$, and $RY_{12}$ on the base member 121, it is possible to form each of the first bridge circuit BC11, the second bridge circuit BC12 and the third bridge circuit BC13 as closed circuits completed on the base member 121.

In a case that the strain sensitive elements constructing a bridge circuit are printed on a base member while the fixed resistance elements constructing the bridge circuit are provided on the outside of the base member, for example, provided on the signal processing unit; then in order to allow the bridge circuit be a closed circuit, it is necessary to connect the strain sensitive elements on the base member and the fixed resistance elements of the signal processing unit with lead wires, etc. In this case, the wires on the base member and the lead wires are connected by joining the lead wires to electrodes provided on the base member. However, in a case that junction resistances arise in the junction parts between the electrodes and the lead wires, then the junction resistances will become internal resistances of the bridge circuit to thereby cause a large error in the strain detection. Therefore, the method of junction is limited to the soldering junction in which the junction resistances are small to such an extent that the junction resistances are substantially neglectable.

However, in order to perform the soldering junctions satisfactorily, it is necessary to provide comparatively large electrodes on the base member, and to secure the pitch(es) between the electrodes. Therefore, the base member has to be large. Further, in order to perform the soldering junctions satisfactorily, it is necessary to pile up solder such that the solder has a certain level of thickness, this also hinders downsizing of the triaxial force sensor.

In contrast, the first embodiment forms each of the first bridge circuit BC11, the second bridge circuit BC12 and the third bridge circuit BC13 as a closed circuit completed on the base member 121, such that the connection between the base member 121 and the signal processing unit via the terminals $T_{11}$ to $T_{18}$ is merely a junction for connecting the first bridge circuit BC11, the second bridge circuit BC12 and the third bridge circuit BC13 to the power source and the calculating unit. Therefore, in the first embodiment, the junction resistances are allowed to occur in the junction parts between the terminals $T_{11}$ to $T_{18}$ and the lead wires $L_{11}$ to $L_{18}$, thereby making it possible to adopt any other methods which is different from the soldering junction, such as for example the junction using an anisotropic conductive film. Note that by using the anisotropic conductive film, it is possible to suppress the size of electrodes, the pitch between the electrodes, and the thickness of the junction parts to be about 10% (one-tenth) of those of the soldering junction, respectively. Therefore, in a case that the downsizing of the triaxial force sensor 1000 is desired, the junction using the anisotropic conductive film is advantageous.

The effects brought about by the strain gage 120 and the triaxial force sensor 1000 of the first embodiment are as follows.

In the strain gage 120 of the first embodiment, the fixed resistance elements $RX_{11}$ and $RX_{12}$ of the first bridge circuit BC11 and the fixed resistance elements $RY_{11}$ and $RY_{12}$ of the second bridge circuit BC12 are formed on the base member 121, thereby making it possible to realize the effects described about in Items (1-2) and (1-3). Furthermore, since the fixed resistance elements $RX_{11}$, $RX_{12}$, $RY_{11}$, and $RY_{12}$ are formed of the same material as the material forming the strain sensitive elements $X_{11}$, $X_{12}$, $Y_{11}$, and $Y_{12}$, it is possible to realize the effect described about in Item (1-1).

In the strain gage 120 of the first embodiment, the sensitive area 121s is formed with only the strain sensitive elements $X_{11}$, $X_{12}$, $Y_{11}$, $Y_{12}$, $Z_{11}$, and $Z_{12}$, whereas the terminals $T_{11}$ to $T_{18}$ and the fixed resistance elements $RX_{11}$, $RX_{12}$, $RY_{11}$, and $RY_{12}$ are formed on the non-sensitive areas 121n1 and 121n2. Therefore, it is possible to make the diameter (size) of the sensitive area 121s to be downsized or small, and consequently to make the flexure plate 111 of the triaxial force sensor 1000 to be small. Downsizing the flexure plate 111 leads to downsizing the triaxial force sensor 1000, which is preferred.

In the strain gage 120 of the first embodiment, since the electrodes $T_{11}$ to $T_{18}$ are provided in the non-sensitive areas 121n1 and 121n2, it is possible to increase the sizes of the electrodes $T_{11}$ to $T_{18}$ as necessary, without making the diameter of the sensitive area 121s to be great, thereby making it possible to easily carry out an operation for junction with respect to the lead wires, etc.

The triaxial force sensor 1000 of the first embodiment is provided with the strain gage 120, and thus can achieve the similar effects as the strain gage 120.

With respect to the first embodiment described above, it is also possible to adopt modifications described in the following.

In the strain gage 120, the strain sensitive elements $Z_{11}$ and $Z_{12}$ may be formed in the non-sensitive area 121n1 and/or non-sensitive area 121n2. In this case, since no flexure is generated in the non-sensitive areas 121n1 and 121n2, the strain sensitive elements $Z_{11}$ and $Z_{12}$ function substantially as fixed resistance elements (third-direction fixed resistance elements).

Even in a case that the strain sensitive elements $Z_{11}$ and $Z_{12}$ function as the fixed resistance elements, it is also possible to detect the load in the direction x with the first bridge circuit BC11 and detect the load in the direction y with the second bridge circuit BC12, in a similar manner as in the above-described first embodiment. Further, it is also possible to detect the load in the direction Z. The reason for this is since, in a case that the load in the direction Z acts on the load receiving part 112 so as to generate the change in the resistance values of the strain sensitive elements $X_{11}$, $X_{12}$, $Y_{11}$, and $Y_{12}$, then this changes each of the combined resistance of the first bridge circuit BC11 and the combined resistance of the second bridge circuit BC12, which in turn also changes the balance of the resistance values between the elements of the third bridge circuit BC13 even if the resistance values of the strain sensitive elements $Z_{11}$ and $Z_{12}$ are constant.

It is allowable that the strain gage 120 does not have the strain sensitive elements $Z_{11}$ and $Z_{12}$. In such a case, for example, the first bridge circuit BC11 and the second bridge circuit BC12 are connected with two arc-like wires W1, rather than being connected with the strain sensitive elements $Z_{11}$ and $Z_{12}$.

Even in a case that the strain sensitive elements $Z_{11}$ and $Z_{12}$ are not provided or are omitted, it is also possible to detect the load in the direction x with the first bridge circuit BC11 and to detect the load in the direction y with the second bridge circuit BC12, in a similar manner as in the above-described first embodiment. A strain gage 120 in such a modification can be used in a biaxial force sensor. Alternatively, it is also possible to link the first Wheatstone bridge circuit and the second Wheatstone bridge circuit, which are possessed by such a strain gage as in the modification, with the fixed resistance elements formed in the signal processing unit, to thereby construct a third Wheatstone bridge circuit so that the strain gage in this modification is usable in a triaxial force sensor.

In the strain gage 120, with respect to the fixed resistance elements $RX_{11}$, $RX_{12}$, $RY_{11}$ and $RY_{12}$ formed in the non-sensitive areas 121n1 and 121n2 of the base member 121, it is allowable to allow at least one of these elements to remain on the base member 121, and to provide the remainder of these elements on the outside of the base member 121, for example, on the signal processing unit. Also in such an aspect, by providing at least one of the fixed resistance elements $RX_{11}$ and $RX_{12}$ constructing the first bridge circuit BC11 and the fixed resistance elements $RY_{11}$ and $RY_{12}$ constructing the second bridge circuit BC12 in the non-sensitive area 121n1 and/or the non-sensitive area 121n2 on the base member 121, it is possible to realize the effect of suppressing the occurrence of the temperature error in the strain gage 120 and the triaxial force sensor 1000.

In the non-sensitive area 121n1 provided on one side in the direction y (the second direction) of the sensitive area 121s, the fixed resistance elements $RX_{11}$ and $RX_{12}$ and the terminals $T_{11}$ to $T_{14}$ may be aligned in a row or array along the direction x (the first direction) orthogonal to the direction y (the second direction). In the non-sensitive area 121n2 provided on the other side in the direction y (the second direction) of the sensitive area 121s, the fixed resistance elements $RY_{11}$ and $RY_{12}$ and the terminals $T_{15}$ to $T_{18}$ may also be aligned in a row along the direction x (the first direction) orthogonal to the direction y (the second direction).

Figure 4:
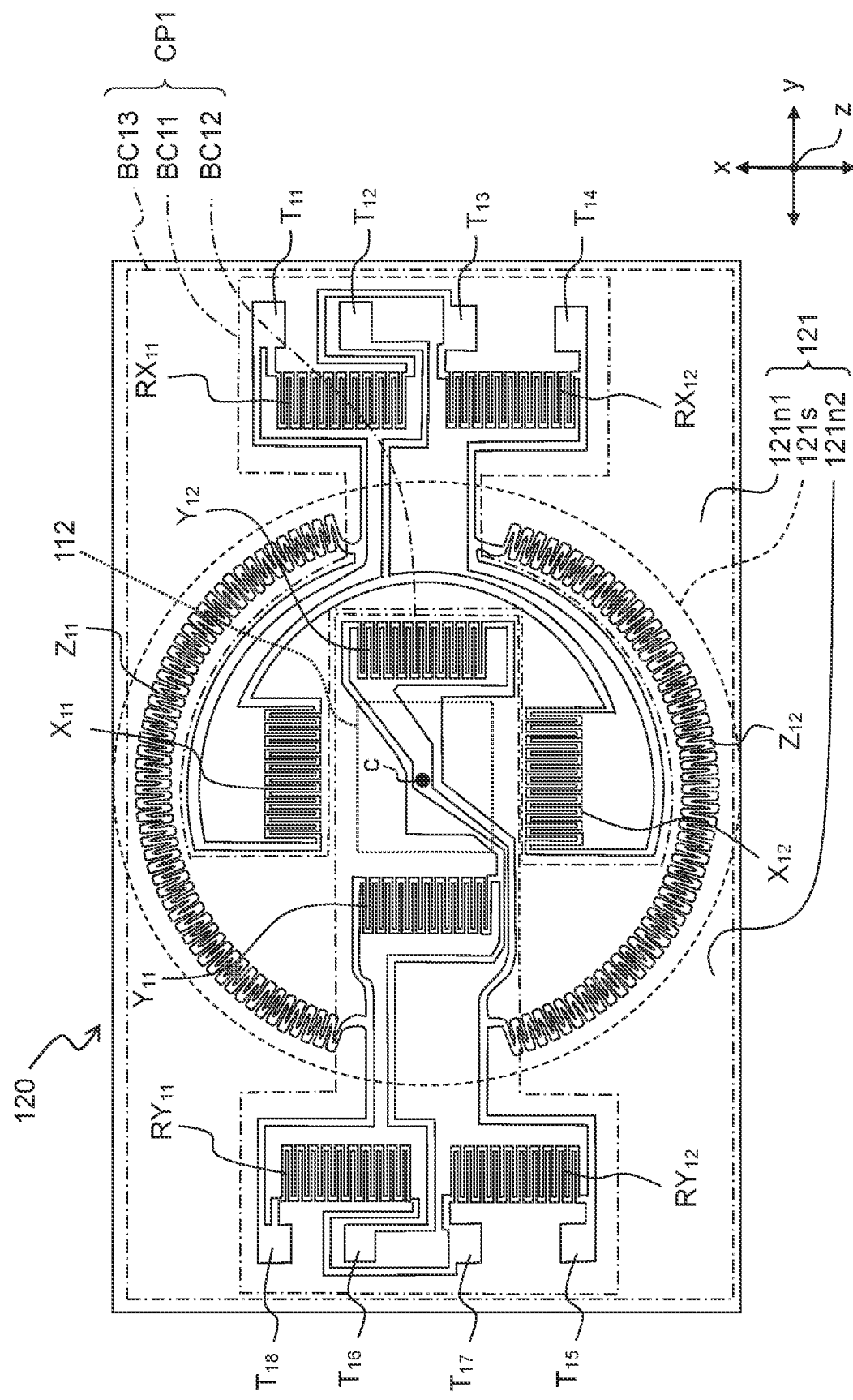
FIG. 4 depicts a modification of the wiring pattern of the strain gage according to the first embodiment of the present invention.

As shown in FIG. 4, the fixed resistance elements $RX_{11}$ and $RX_{12}$ may be formed in an area (a part), of the non-sensitive area 121n1, which is close to the sensitive area 121s, whereas the terminals $T_{11}$ to $T_{14}$ may be formed in an area (a part), of the non-sensitive area 121n1, which is far from the sensitive area 121s. Namely, in the non-sensitive area 121n1, the terminals $T_{11}$ to $T_{14}$ may be arranged on an opposite side of the fixed resistance elements $RX_{11}$ and $RX_{12}$ from the sensitive area 121s. This is similarly applicable also to the arrangement of the fixed resistance elements $RY_{11}$ and $RY_{12}$ and the terminals $T_{15}$ to $T_{18}$ in the non-sensitive area 121n2. By arranging the terminals $T_{11}$ to $T_{15}$ on the outside in this manner, the lead wires, etc., can be joined to the terminals $T_{11}$ to $T_{18}$ more easily.

Any one or more of the terminals $T_{11}$ to $T_{18}$ may be formed in the sensitive area 121s. In this case, it is desirable to provide any one or more of the terminals $T_{11}$ to $T_{18}$ in the vicinity of the center c in which any one or more of the terminals $T_{11}$ to $T_{18}$ is/are attached at a location below or under the load receiving part 112 and in which any strain is less likely to be generated.

In the sensitive area 121s, the strain sensitive elements $Z_{11}$ and $Z_{12}$ may be arranged on the side of the center c (on the inner side) of the strain sensitive elements $X_{11}$, $X_{12}$, $Y_{11}$, and $Y_{12}$. Further, the strain sensitive elements $X_{11}$, $X_{12}$, $Y_{11}$, and $Y_{12}$ may be each formed into an arc-like shape such that the width direction of the grid thereof may be the circumferential direction of the sensitive area 121s. Such a strain gage 120 can be attached to the flexure plate 111 to which the load receiving part 112 having a cylindrical shape with the rotating axis A1 as the center thereof is connected, and can be used satisfactorily.

It is allowable that the base member 121 of the strain gage 120 has any shape, for example, such as an elliptical shape, and that the base member 121 has only either one of the non-sensitive areas 121n1 and 121n2. In the base member 121 only having either one of the non-sensitive areas 121n1 and 121n2, it is allowable to form all of the fixed resistance elements $RX_{11}$, $RX_{12}$, $RY_{11}$, and $RY_{12}$ and the terminals $T_{11}$ to $T_{18}$ in that non-sensitive area which is either one of the non-sensitive areas 121n1 and 121n2. Other than those described above, the base member 121 may have any shape including the sensitive area to be attached to the flexure plate of the multi-axis force sensor, and the non-sensitive area to be arranged outside of that area.

The strain gage 120 of the above-described first embodiment can also be used for a flexure member of any other sensor which is different from the multi-axis force sensor.

Second Embodiment

An explanation will be made on a second embodiment of the multi-axis force sensor and the strain gage of the present invention, with a triaxial force sensor 2000 which is used as a tactile sensor of a robot hand and a strain gage 220 included in the triaxial sensor 2000 as examples thereof, with mainly reference to FIGS. 5 to 9.

Figure 5:
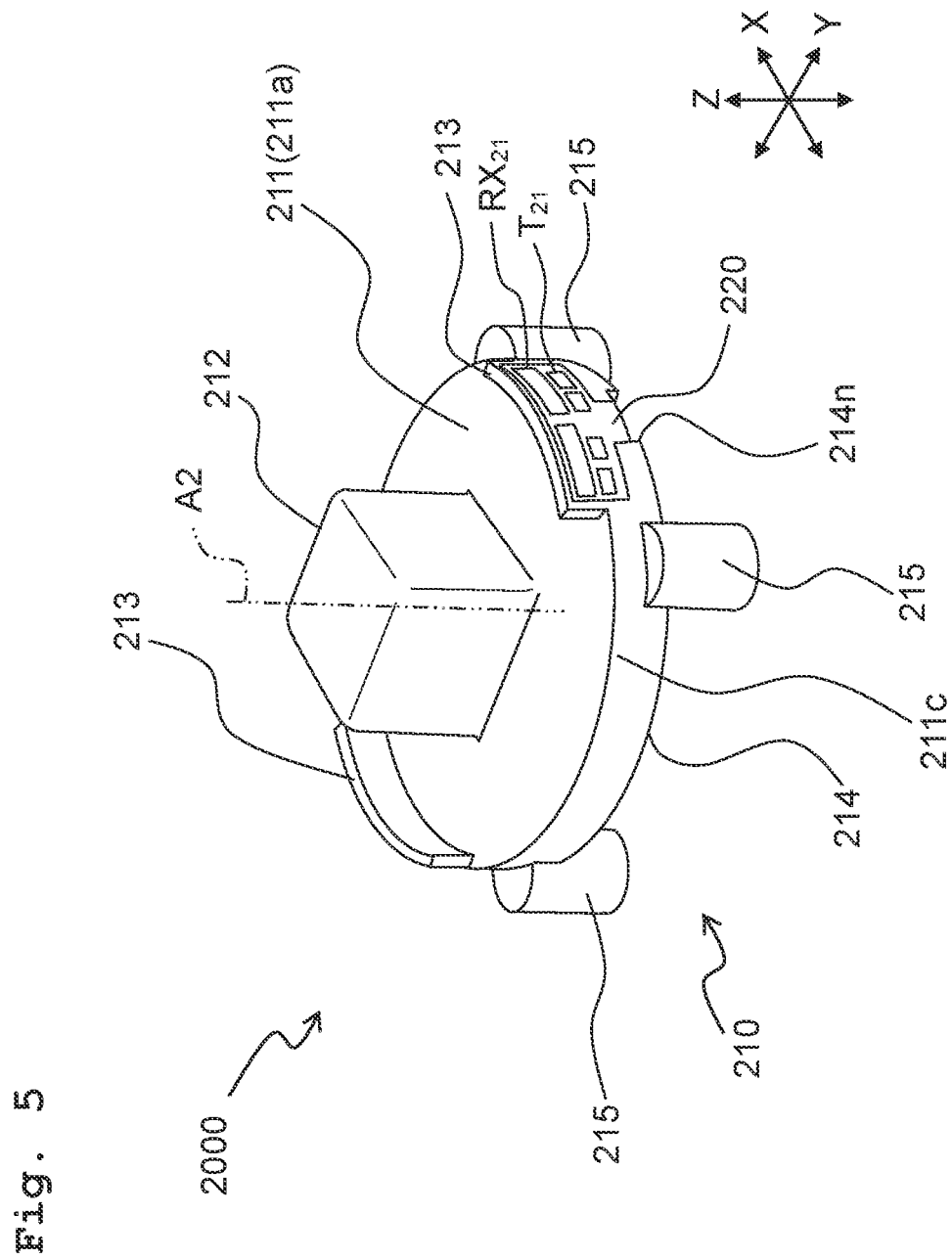
FIG. 5 is a perspective view of a triaxial force sensor according to a second embodiment of the present invention.
Figure 6:
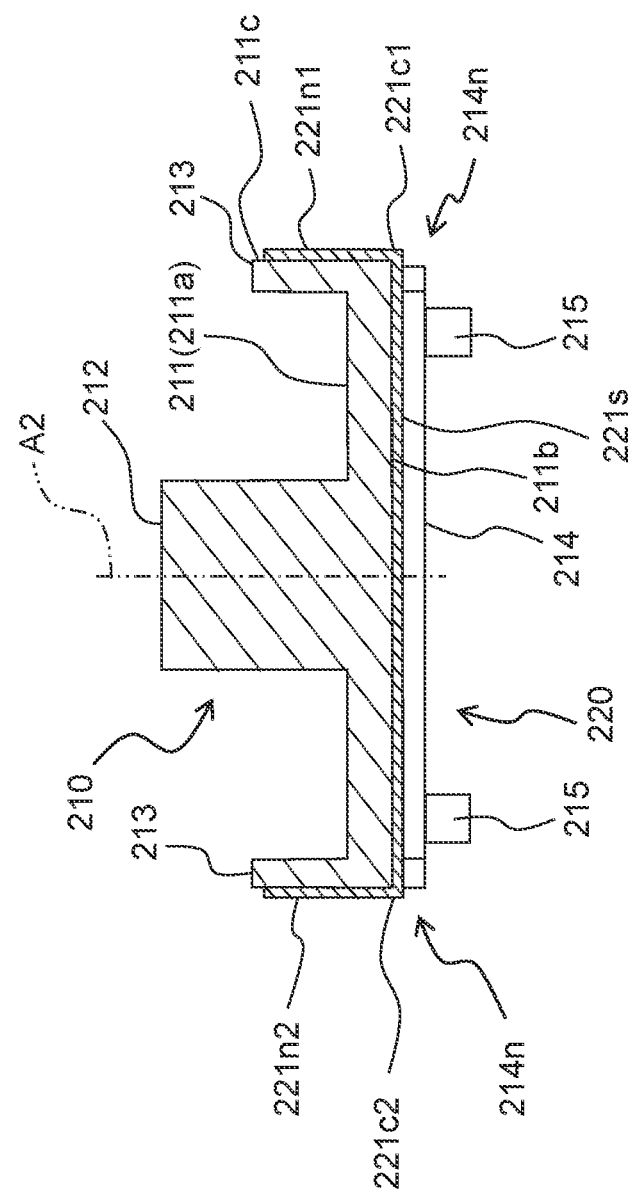
FIG. 6 is a cross-sectional view of the triaxial force sensor depicted in FIG. 5 taken along a Y-Z plane including an axis A2.

The triaxial force sensor 2000 of the second embodiment has a main body part 210 rotationally symmetrical about an axis A2, and a strain gage 220 attached to the main body part 210, as depicted in FIGS. 5 and 6. The main body part 210 includes a flexure plate (flexure member) 211 which has a disc-shape and of which rotating axis is the axis A2; a load receiving part (a load applied part) 212 upstanding, in an axis direction of the rotating axis, from a central part of a surface 211a of the flexure plate 211; a pair of holding plates 213 upstanding in the axial direction from a peripheral edge part of the surface 211a of the flexure plate 211; a peripheral wall 214 upstanding in the axial direction from a peripheral edge part of a back surface 211b of the flexure plate 211, and four leg parts 215 provided on the peripheral wall 214. The main body part 210 is formed, for example, integrally with a synthetic resin material.

In the explanation of the second embodiment, two radial directions orthogonal to each other in the flexure plate 211 are referred to as a direction X (first direction) and a direction Y (second direction), respectively, of the triaxial force sensor 2000 and the main body part 210. Further, a direction of the axis A2 orthogonal to the direction X and the direction Y is referred to as a direction Z (third direction) of the triaxial force sensor 2000 and the main body part 210.

The flexure plate 211 is a disc which is strained (distorted) in a case of receiving, via the load receiving part 212, a load applied from outside onto the main body part 210 of the triaxial force sensor 2000. The strain in the flexure plate 211 is generated or arises on the front surface 211a and the back surface 211b of the flexure plate 211 (in FIG. 5, upper and lower surfaces orthogonal to the axis A2), but does not arise or is small enough to be neglectable on a lateral surface 211c of the flexure plate 211 (the peripheral or circumferential surface parallel to the axis A2 in FIG. 5). In this specification, the term "flexure area" is used to refer to an area which is strained by receiving an external load in the flexure plate 211, such as the front surface 211a and the back surface 211b of the flexure plate 211 in the second embodiment. The diameter and the thickness of the flexure plate 211 is arbitrary.

The load receiving part 212 is a part which receives a load from outside and thereby moves so as to generate a strain in the flexure plate 211, and which is, for example, a prism (square rod) having a square-shaped cross section. The load receiving part 212 is provided on the front surface 211a of the flexure plate 211 such that the central axis of the prism is coincident with the rotating axis (axis A2) of the flexure plate 211, namely coaxially with the flexure plate 211.

The pair of holding plates 213 are parts to which parts (non-sensitive areas 221n1 and 221n2), of a base member 221 (FIG. 7) of the strain gage 220 (to be described later on) are attached, respectively. The pair of holding plates 213 upstand from the front surface 211a of the flexure plate 211 so as to face each other (to be opposite to each other), while sandwiching the load receiving part 212 therebetween in the direction Y; each of the pair of holding plates 213 has a curved surface along the outer circumference of the flexure plate 211.

The peripheral wall 214 upstands from the back surface 211b of the flexure plate 211 along the outer circumference of the back surface 211b, and surrounds the back surface 211b. Further, the peripheral wall 214 is provided with a pair of cutout parts 214n so as to sandwich the load receiving part 212 therebetween in the direction Y. Namely, the pair of cutout parts 214n are arranged at positions, respectively, in the circumferential direction of the flexure plate 211, at which the pair of cutout parts 214 overlap with the pair of holding plate 213, respectively. The peripheral wall 214 is used as a guide in a case of attaching the strain gage 220 to the flexure plate 211, details of which will be described later on.

The leg parts 215 are stands each of which is used to attach the triaxial force sensor 2000 to the robot hand, and are provided as the four leg parts 215 on the peripheral wall 214 at an equal spacing distance therebetween.

Figure 7:
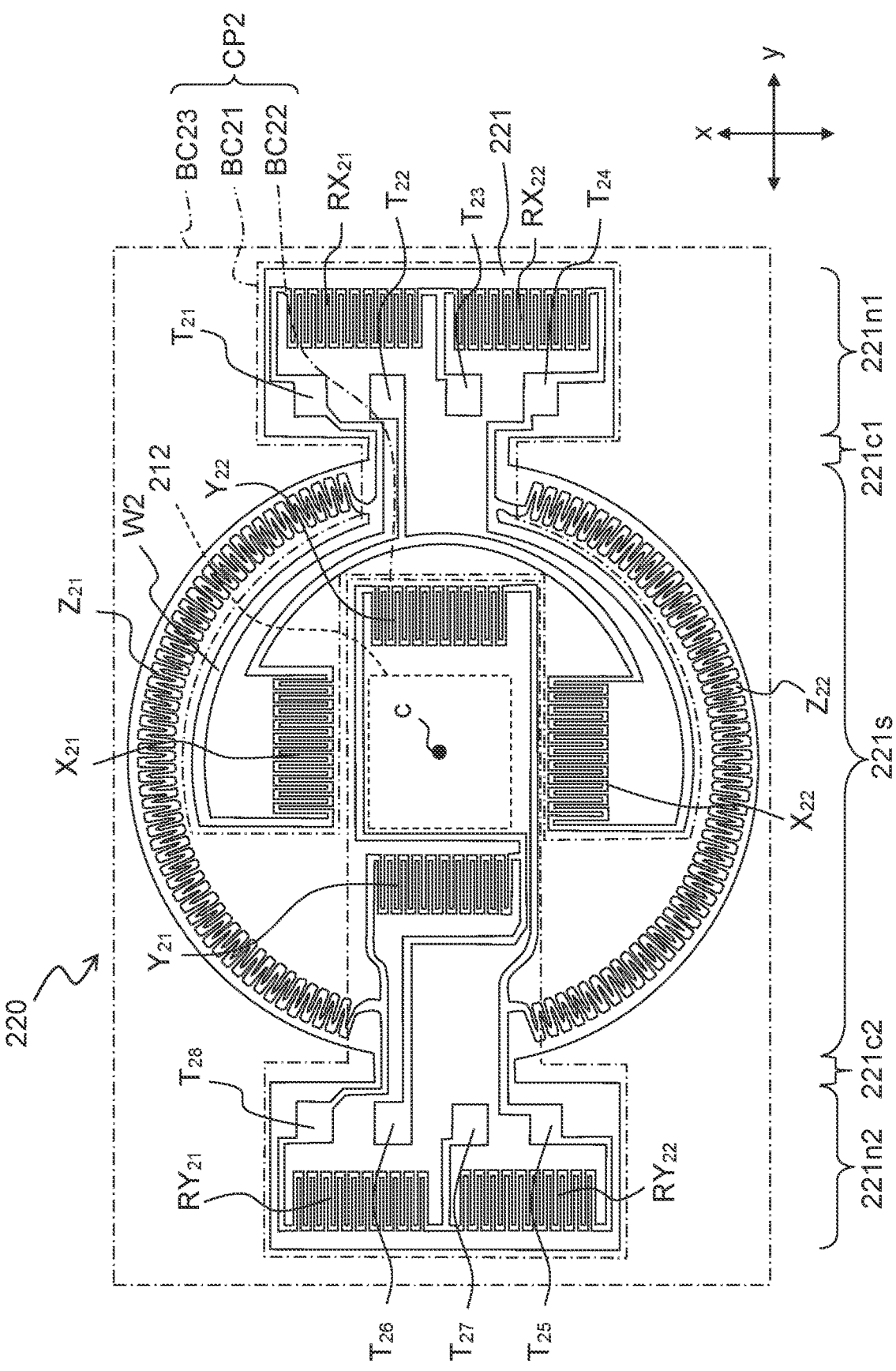
FIG. 7 depicts a wiring pattern of the strain gage according to a second embodiment of the present invention.

FIG. 7 depicts a state before the strain gage 220 depicted in FIG. 5 is provided on or attached to the flexure plate 211 (an expansion or development view). As depicted in FIG. 7, the strain gage 220 includes a base member 221, and a circuit pattern CP2 printed on a surface of the base member 221. The base member 221 has a sensitive area 221s, and non-sensitive areas 221n1 and 221n2 interposing or sandwiching the sensitive area 221s therebetween. The circuit pattern CP2 includes six strain sensitive elements $X_{21}$, $X_{22}$, $Y_{21}$, $Y_{22}$, $Z_{21}$, and $Z_{22}$, four fixed resistance elements $RX_{21}$, $RX_{22}$, $RY_{21}$, and $RY_{22}$, eight terminals $T_{21}$ to $T_{28}$, and a wire W2 connecting those elements (members). Note that in the following explanation, a direction y (second direction) refers to a direction in which the non-sensitive areas 221n1 and 221n2 sandwich the sensitive area 221s therebetween, whereas a direction x (first direction) refers to a direction orthogonal to the direction y on the surface of the base member 221.

The base member 221 is a flexible resin film and has the sensitive area 221s which is circular and which is arranged in the center of the base member 221, a pair of non-sensitive areas 221n1 and 221n2 sandwiching the sensitive area 221s therebetween, and a pair of connecting areas 221c1 and 221c2 which connect or join the pair of non-sensitive areas 221n1 and 221n2 to the sensitive area 221s, respectively. It is preferred that as the resin film used is a resin film which is highly flexible and bendable so that the resin film is easily foldable and bendable; specific examples of the usable resin film include polyester, polyimide, etc. Further, although it is also possible to form the sensitive area 221s, the non-sensitive areas 221n1 and 221n2, and the connecting areas 221c1 and 221c2 with mutually different materials, it is desirable to form those members with a same material such that the temperature property (temperature coefficient of resistance, etc.) is uniform across all the areas. Further, in such a case, it is also desirable to form the base member 221 by integrally cutting out the sensitive area 221s, the non-sensitive areas 221n1 and 221n2, and the connecting areas 221c1 and 221c2 from vicinal parts of an integrally formed material (for example, a sheet of polyester, polyimide, etc.). By virtue of this, it is possible to further uniformize the temperature properties of the respective areas.

Since the sensitive area 221s is an area to be attached or adhered to the back surface 211b of the flexure plate 211 of the main body part 210, the sensitive area 221s has a diameter equivalent to or smaller than that of the back surface 211b of the flexure plate 211. On one surface of the sensitive area 221s, there are formed the strain sensitive elements $X_{21}$ and $X_{22}$ (first-direction strain sensitive elements) with a center c being sandwiched therebetween in the direction x, the strain sensitive elements $Y_{21}$ and $Y_{22}$ (second-direction strain sensitive elements) with the center c being sandwiched therebetween in the direction y, and the strain sensitive elements $Z_{21}$ and $Z_{22}$ (third-direction strain sensitive elements) along the outer circumference.

The strain sensitive elements $X_{21}$ and $X_{22}$ are formed parallel to each other, with the direction y as the width direction of grid thereof, respectively. The strain sensitive element $X_{21}$ and the strain sensitive element $X_{22}$ are formed at positions equidistant from the center c respectively (a distance between the center c and the strain sensitive element $X_{21}$ and the distance between the center c and the strain sensitive element $X_{22}$ are identical). The distance in the direction x between the strain sensitive element $X_{21}$ and the strain sensitive element $X_{22}$ is longer than the width in the direction x of the load receiving part 212 of the main body part 210.

The strain sensitive elements $Y_{21}$ and $Y_{22}$ are formed parallel to each other, with the direction x as the width direction of grid thereof, respectively. The strain sensitive element $Y_{21}$ and the strain sensitive element $Y_{22}$ are formed at positions equidistant from the center c respectively (a distance between the center c and the strain sensitive element $Y_{21}$ and the distance between the center c and the strain sensitive element $Y_{22}$ are identical). The distance in the direction y between the strain sensitive element $Y_{21}$ and the strain sensitive element $Y_{22}$ is longer than the width in the direction y of the load receiving part 212 of the main body part 210.

The strain sensitive elements $Z_{21}$ and $Z_{22}$ have arc-like shapes respectively and are formed to face each other in the direction x, with the circumferential direction of the sensitive area 221s as the width direction of grid thereof. The strain sensitive elements $Z_{21}$ and $Z_{22}$ are arranged on an opposite side of the strain sensitive elements $X_{21}$, $X_{22}$, $Y_{21}$, and $Y_{22}$ from the center c (outside of the strain sensitive elements $X_{21}$, $X_{22}$, $Y_{21}$, and $Y_{22}$).

The pair of non-sensitive areas 221n1 and 221n2 are shaped to interpose the sensitive area 221s in the direction y. Each of the pair of non-sensitive areas 221n1 and 221n2 has a rectangular shape in which the direction x is the long side direction and the direction y is the short side direction.

Fixed resistance elements $RX_{21}$ and $RX_{22}$ (first-direction fixed resistance elements) are formed in an area (a part), of the surface of the non-sensitive area 221n1, which are far from the sensitive area 221s, so that each of the fixed resistance elements $RX_{21}$ and $RX_{22}$ extends in the direction x and that the fixed resistance elements $RX_{21}$ and $RX_{22}$ are aligned in the direction x; on the other hand, four terminals $T_{21}$, $T_{22}$, $T_{23}$, and $T_{24}$ are formed in an area (a part), of the surface of the non-sensitive area 221n1, which is close to the sensitive area 221s, so that the terminals $T_{21}$, $T_{22}$, $T_{23}$ and $T_{24}$ are aligned in the direction x. Namely, in the non-sensitive area 221n1, the fixed resistance elements $RX_{21}$ and $RX_{22}$ are arranged on an opposite side of the terminals $T_{21}$ to $T_{24}$ from the sensitive area 221s.

Similarly, fixed resistance elements $RY_{21}$ and $RY_{22}$ (second-direction fixed resistance elements) are formed in an area (a part), of the surface of the non-sensitive area 221n2, which is far from the sensitive area 221s, so that each of the fixed resistance elements $RY_{21}$ and $RY_{22}$ extends in the direction x and that the fixed resistance elements $RY_{21}$ and $RY_{22}$ are aligned in the direction x; on the other hand, four terminals $T_{25}$, $T_{26}$, $T_{27}$, and $T_{28}$ are formed in an area, of the surface of the non-sensitive area 221n2, which is close to the sensitive area 221s, so that the four terminals $T_{25}$, $T_{26}$, $T_{27}$, and $T_{28}$ are aligned in the direction x. Namely, in the non-sensitive area 221n2, the fixed resistance elements $RY_{21}$ and $RY_{22}$ are arranged on an opposite side of the terminals $T_{25}$ to $T_{28}$ from the sensitive area 221s.

The connecting areas 221c1 and 221c2 connecting the non-sensitive areas 221n1 and 221n2 to the sensitive area 221s, respectively each have a size in the direction x (width), orthogonal to the direction y in which the non-sensitive areas 221n1 and 221n2 are connected to the sensitive area 221s, which is smaller than a size in the direction x (width) of each of the sensitive area 221s and the non-sensitive areas 221n1 and 221n2. Accordingly, the base member 221 has a shape which is constricted at the connecting areas 221c1 and 221c2.

Figure 8:
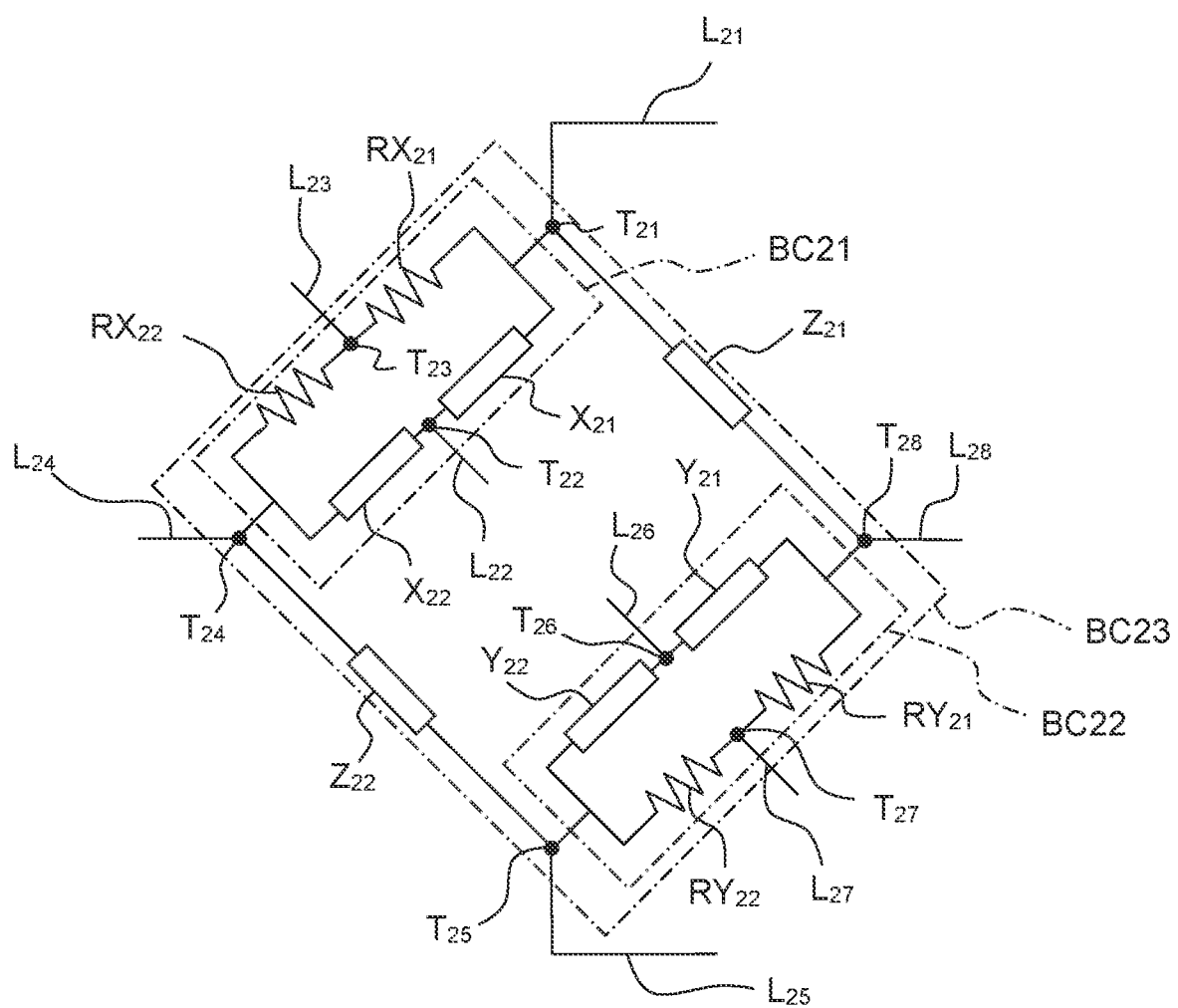
FIG. 8 is a circuit diagram corresponding to the wiring pattern of the strain gage of FIG. 7.

As shown in FIGS. 7 and 8, the wire W2 connects the strain sensitive elements $X_{21}$ and $X_{22}$ and the fixed resistance elements $RX_{21}$ and $RX_{22}$ to construct a first bridge circuit BC21 (first Wheatstone bridge circuit). Further, the terminal $T_{21}$ is connected between the strain sensitive element $X_{21}$ and the fixed resistance element $RX_{21}$, the terminal $T_{22}$ is connected between the strain sensitive elements $X_{21}$ and $X_{22}$, the terminal $T_{23}$ is connected between the fixed resistance elements $RX_{21}$ and $RX_{22}$, and the terminal $T_{24}$ is connected between the strain sensitive element $X_{22}$ and the fixed resistance element $RX_{22}$.

Similarly, the wire W2 connects the strain sensitive elements $Y_{21}$ and $Y_{22}$ and the fixed resistance elements $RY_{21}$ and $RY_{22}$ to construct a second bridge circuit BC22 (second Wheatstone bridge circuit). Further, the terminal $T_{28}$ is connected between the strain sensitive element $Y_{21}$ and the fixed resistance element $RY_{21}$, the terminal $T_{26}$ is connected between the strain sensitive elements $Y_{21}$ and $Y_{22}$, the terminal $T_{27}$ is connected between the fixed resistance elements $RY_{21}$ and $RY_{22}$, and the terminal $T_{25}$ is connected between the strain sensitive element $Y_{22}$ and the fixed resistance element $RY_{22}$.

One end of the strain sensitive element $Z_{21}$ is connected to the first bridge circuit BC21 between the strain sensitive element $X_{21}$ and the fixed resistance element $RX_{21}$, whereas the other end of the strain sensitive element $Z_{21}$ is connected to the second bridge circuit BC22 between the strain sensitive element $Y_{21}$ and the fixed resistance element $RY_{21}$. Similarly, one end of the strain sensitive element $Z_{22}$ is connected to the first bridge circuit BC21 between the strain sensitive element $X_{22}$ and the fixed resistance element $RX_{22}$, whereas the other end of the strain sensitive element $Z_{22}$ is connected to the second bridge circuit BC22 between the strain sensitive element $Y_{22}$ and the fixed resistance element $RY_{22}$. By virtue of this, a third bridge circuit BC23 (third Wheatstone bridge circuit) is constructed with the first bridge circuit BC21 and the second bridge circuit BC22 on one pair of opposite sides respectively, and with the strain sensitive elements $Z_{21}$ and $Z_{22}$ on the other pair of opposite sides respectively.

The strain sensitive elements $X_{21}$, $X_{22}$, $Y_{21}$, $Y_{22}$, $Z_{21}$, and $Z_{22}$ and the fixed resistance elements $RX_{21}$, $RX_{22}$, $RY_{21}$, and $RY_{22}$ and the wire W2 included in the circuit pattern CP2 are formed from the same material, or preferably formed from vicinal parts in one material. This material is, for example, copper, a copper alloy such as copper nickel or the like, etc. It is possible to carry out the print of the circuit pattern CP2 on the base member 221 by way of photoetching, printing, evaporation, sputtering, etc.

As depicted in FIGS. 5 and 6, the strain gage 220 is attached to the main body part 210 such that the surface of the base member 221 on a side opposite to the surface of the base member 221 formed with the circuit pattern CP2 may be in contact with the main body part 210.

Specifically, the sensitive area 221s of the base member 221 is attached to the back surface 211b of the flexure plate 211 such that the direction x and the direction y are coincident with the direction X and the direction Y, respectively, of the main body parts 210 and that the center c is coincident with the axis A2. Note that as described above, the distance in the direction x between the strain sensitive elements $X_{21}$ and $X_{22}$ is larger than the size in the direction x of the load receiving part 212, whereas the distance in the direction y between the strain sensitive elements $Y_{21}$ and $Y_{22}$ is larger than the size in the direction y of the load receiving part 212. Therefore, in a state that the sensitive area 221s of the base member 221 is attached to the flexure plate 211, the strain sensitive elements $X_{21}$ and $X_{22}$ and the strain sensitive elements $Y_{21}$ and $Y_{22}$ are arranged in areas arranged on the outside of the load receiving part 212 in the direction x and/or the direction y and in each of which a comparatively large strain is generated. Note that in FIGS. 7 and 9, a dotted line depicts the outline of the load receiving part 212 in the state that the base member 221 is attached to the flexure plate 211, thereby showing a positional relationship between the load receiving part 212 and the strain sensitive elements $X_{21}$, $X_{22}$, $Y_{21}$, and $Y_{22}$.

The pair of non-sensitive areas 221n1 and 221n2 of the base member 221 are folded or bent and attached to the lateral surfaces 211c of the flexure plate 211 and to the outer surfaces of the holding plates 213, which extend upwardly from the lateral surfaces 211c. Accordingly, the terminals $T_{21}$, $T_{22}$, $T_{23}$, and $T_{24}$ formed in the non-sensitive area 221n1 and the terminals $T_{25}$, $T_{26}$, $T_{27}$, and $T_{28}$ formed in the non-sensitive area 221n2 are exposed to the outside of the flexure plate 211, while facing or being oriented toward the outer side in the radial direction of the flexure plate 211.

The pair of connecting parts 221c1 and 221c2 pass through the cutout parts 214n, respectively, of the peripheral wall 214 and are bent at positions where the back surface 211b and the lateral surface 211c of the flexure plate 211 are connected to each other.

In a case of attaching the strain gage 220 to the base member 221, the peripheral edge part of the sensitive area 221s of the base member 221 is brought into contact with the inner circumferential surface of the peripheral wall 214, and the pair of connecting areas 221c1 and 221c2 of the base member 221 are arranged at the pair of cutout parts 214n, respectively, of the circumferential wall 214, thereby making it possible to easily position (align) the strain gage 220 with respect to the main body part 210 and the flexure plate 211.

Specifically, by bringing the peripheral edge part of the sensitive area 221s of the base member 221 into contact with the inner circumferential surface of the peripheral wall 214, the center c of the sensitive area 221s is positioned so as to be coincident with the axis A2 of the main body part 210, and the movements in the direction X and the direction Y of the sensitive area 221s are restricted (regulated). Next, by arranging the pair of connecting areas 221c1 and 221c2 of the strain gage 220 at the cutout parts 214n, respectively, of the circumferential wall 214, the strain gage 220 is positioned (aligned) with respect to the main body part 210 and the flexure plate 211 also in the circumferential direction of which center is the axis A2.

Next, an explanation will be made on a method for using the triaxial force sensor 2000 and the strain gage 220 according to the second embodiment, and an operation thereof.

In a case that the triaxial force sensor 2000 is used, for example, as a tactile sensor of a robot hand, the triaxial force sensor 2000 is firstly fixed with respect to a fingertip of the robot hand via the leg parts 215. Next, the terminals $T_{21}$ to $T_{28}$ are connected respectively to a signal processing unit (not shown) by using lead wires $L_{21}$ to $L_{28}$ (FIG. 8). It is possible to connect the terminal $T_{21}$ to $T_{28}$ and the lead wires $L_{21}$ to $L_{28}$ by an arbitrary method. For example, it is possible to use a solder or an anisotropic conductive film (ACF) therefor.

The terminals $T_{21}$ and $T_{23}$ are connected, with the lead wires $L_{21}$ and $L_{23}$, respectively, to the power source (not shown) of the signal processing unit. The terminals $T_{22}$ and $T_{23}$, the terminals $T_{26}$ and $T_{27}$ and the terminals $T_{24}$ and $T_{28}$ are connected, with the lead wires $L_{22}$ and $L_{23}$, the lead wires $L_{26}$ and $L_{27}$ and the lead wires $L_{24}$ and $L_{28}$, respectively, to a calculating unit (not shown) in the signal processing unit via an amplifier (not shown) in the signal processing unit.

In a case that the triaxial force sensor 2000 is operating, an input voltage Ei is applied between the terminal $T_{21}$ and the terminal $T_{25}$ by the power source. The resistance value of each of the strain sensitive elements constructing the first bridge circuit BC21, the second bridge circuit BC22 and the third bridge circuit BC23 and the resistance value of each of the fixed resistance elements constructing the first bridge circuit BC21, the second bridge circuit BC22 and the third bridge circuit BC23 have been adjusted so that the voltages are equal or uniform between the terminals $T_{22}$ and $T_{23}$, that the voltages are equal between the terminals $T_{26}$ and $T_{27}$, and that the voltages are equal between the terminals $T_{24}$ and $T_{28}$, in a state that the sensitive area 221s of the base member 221 has no flexure. Therefore, in a state that the flexure plate 211 has no strain and that the sensitive area 221s has no flexure (FIG. 3(a)), there is no difference in the potential between the terminals $T_{22}$ and $T_{23}$, between the terminals $T_{26}$ and $T_{27}$, and between the terminals $T_{24}$ and $T_{28}$, and thus the calculating unit does not calculate the strain.

Next, in a case that a load in the direction X is applied to the load receiving part 212, the load receiving part 212 receives the load and thus moves to cause a strain to be generated in the flexure plate 211 (FIG. 3(b)). On this occasion, the sensitive area 221s of the base member 221 of the strain gage 220 attached to the flexure plate 211 also flexes integrally with the flexure plate 211, so as to cause a compressive strain to be generated in the strain sensitive element $X_{21}$ and to cause a tensile strain (an elongation strain) to be generated in the strain sensitive element $X_{22}$. By virtue of this, each of the resistance values of the strain sensitive elements $X_{21}$ and $X_{22}$ is changed to thereby generate a potential difference (a difference in the potential) between the terminals $T_{22}$ and $T_{23}$ of the first bridge circuit BC21 including the strain sensitive elements $X_{21}$ and $X_{22}$. Based on this potential difference, the calculating unit obtains the amount of the strain generated in the flexure plate 211 so as to obtain magnitude of the load in the direction X acting on the load receiving part 212. Note that on this occasion, no strain is generated in the lateral surface 211c of the flexure plate 211 and the holding plates 213, due to which the resistance values of the fixed resistance elements $RX_{21}$ and $RX_{22}$ are constant. Also in a case that a load in the direction Y is applied to the load receiving part 212, the magnitude of the load in the direction Y acting on the load receiving part 212 is obtained in a similar manner as described above.

In a case that a load in the direction Z is applied to the load receiving part 212, tensile strains are generated in all the strain sensitive elements $X_{21}$, $X_{22}$, $Y_{21}$, $Y_{22}$, $Z_{21}$, and $Z_{22}$ since the flexure plate 211 and the sensitive area 221s of the base member 221 are curved such that the centers thereof are projected. By virtue of this, each of the combined resistance of the first bridge circuit BC21, the combined resistance of the second bridge circuit BC22, and the resistance values of the strain sensitive elements $Z_{21}$ and $Z_{22}$ is changed to thereby generate a potential difference between the terminals $T_{24}$ and $T_{28}$ of the third bridge circuit BC23. Based on this difference in the potential, the calculating unit obtains the amount of the strain generated in the flexure plate 211 so as to obtain the magnitude of the load in the direction Z acting on the load receiving part 212.

Hereinbelow, an explanation will be given on the significance of printing, on the base member 221, the fixed resistance elements $RX_{21}$ and $RX_{22}$ of the first bridge circuit BC21 and the fixed resistance elements $RY_{21}$ and $RY_{22}$ of the second bridge circuit BC22 and of forming the fixed resistance elements $RX_{21}$ and $RX_{22}$ of the first bridge circuit BC21 and the fixed resistance elements $RY_{21}$ and $RY_{22}$ of the second bridge circuit BC22 with a same material as that forming the strain sensitive elements $X_{21}$, $X_{22}$, $Y_{21}$, and $Y_{22}$.

(2-1) By forming the fixed resistance elements $RX_{21}$, $RX_{22}$, $RY_{21}$, and $RY_{22}$ in the above-described manner, the fixed resistance elements $RX_{21}$, $RX_{22}$, $RY_{21}$ and $RY_{22}$ are formed from the same material as the strain sensitive elements $X_{21}$, $X_{22}$, $Y_{21}$, $Y_{22}$, $Z_{21}$, and $Z_{22}$, and at the positions in the vicinity thereof. Here, the temperature coefficient of resistance indicating a change ratio of the resistance value with respect to the change in the temperature (temperature change) is a physical property value depending on the material; therefore, in the second embodiment, the temperature coefficient of resistance is equal among all the strain sensitive elements and all the fixed resistance elements. Further, since the fixed resistance elements $RX_{21}$, $RX_{22}$, $RY_{21}$, and $RY_{22}$ are formed on the base member 221 and thus formed at the locations in the vicinity of the strain sensitive elements $X_{21}$, $X_{22}$, $Y_{21}$, $Y_{22}$, $Z_{21}$, and $Z_{22}$, the changes in the ambient temperature each affecting each of the strain sensitive elements or each of the fixed resistance elements are substantially the same. Therefore, in a case that any change arises in the ambient temperature, the resistance values of all the strain sensitive elements and the resistance values of all the fixed resistance elements change at a same ratio.

In each of the first bridge circuit BC21, the second bridge circuit BC22 and the third bridge circuit BC23, in a case that the balance of the resistance values changes between the resistance elements (the strain sensitive elements and the fixed resistance elements) included therein, then any potential differences arise between the terminals $T_{22}$ and $T_{23}$, between terminals $T_{26}$ and $T_{27}$, and between the terminals $T_{24}$ and $T_{28}$, based on which strains are detected. Therefore, in a case that the balance changes between the resistance values of the strain sensitive elements and the resistance values of the fixed resistance elements due to a change in ambient temperature, any measuring error might be generated due to this change in the balance. In the second embodiment, however, in a case that the ambient temperature changes, the resistance values of all the strain sensitive elements and the resistance values of all the fixed resistance elements change at the same ratio. Therefore, even in a case that the ambient temperature changes, the balance of the resistance values does not change between the respective elements, thereby suppressing the measuring error from occurring. Note that in the formation of the circuit pattern CP2, in a case that vicinal parts of the material (copper, a copper alloy, etc.) prepared as an integral block are used to form the strain sensitive elements, etc., it is possible to make the temperature coefficients of resistance of the strain sensitive elements $X_{21}$, $X_{22}$, $Y_{21}$, $Y_{22}$, $Z_{21}$, and $Z_{22}$, the fixed resistance elements $RX_{21}$, $RX_{22}$, $RY_{21}$, and $RY_{22}$, and the wire W2 to be further uniform, thereby making it possible to more satisfactorily suppress the occurrence of the measuring error.

(2-2) As in the second embodiment, in a case that the fixed resistance elements $RX_{21}$ and $RX_{22}$ of the first bridge circuit BC21 and the fixed resistance elements $RY_{21}$ and $RY_{22}$ of the second bridge circuit BC22 are formed in the non-sensitive areas 221n1 and 221n2 of the base member 221 and that the non-sensitive areas 221n1 and 221n2 are attached or adhered to a part, of the main body part 210, at which any strain is not generated (a part on the outside of the flexure area), it is possible to thereby cause the fixed resistance elements $RX_{21}$, $RX_{22}$, $RY_{21}$, and $RY_{22}$ to function as dummy gages for the purpose of temperature compensation. Therefore, even in a case that any expansion or contraction is generated in the main body part 210 including the flexure plate 211 due to any change in the ambient temperature, it is also possible to suppress the occurrence of a measuring error by compensating the change in the resistance values of the strain sensitive elements $X_{21}$, $X_{22}$, $Y_{21}$, and $Y_{22}$ due to the expansion or the contraction.

(2-3) By printing and forming the fixed resistance elements $RX_{21}$, $RX_{22}$, $RY_{21}$, and $RY_{22}$ on the base member 221, it is possible to form the first bridge circuit BC21, the second bridge circuit BC22 and the third bridge circuit BC23 as closed circuits completed on the base member 221, respectively.

If the strain sensitive elements constructing a bridge circuit are printed on a base member while the fixed resistance elements constructing the bridge circuit are provided on the outside of the base member, for example, provided on the signal processing unit; in order to allow the bridge circuit be a closed circuit, it is necessary to connect the strain sensitive elements on the base member and the fixed resistance elements of the signal processing unit with lead wires, etc. In this case, the wires on the base member and the lead wires are connected by joining the lead wires to electrodes provided on the base member. However, in a case that junction resistances arise in the junction parts between the electrodes and the lead wires, then the junction resistances will become internal resistances of the bridge circuit to thereby cause a large error in the strain detection. Therefore, the method of junction is limited to the soldering junction in which the junction resistances are small to such an extent that the junction resistances are substantially neglectable.

However, in order to perform the soldering junctions satisfactorily, it is necessary to provide comparatively large electrodes on the base member, and to secure the pitch(es) between the electrodes. Therefore, the base member has to be large. Further, in order to perform the soldering junctions satisfactorily, it is necessary to pile up solder such that the solder has a certain level of thickness, this also hinders downsizing of the triaxial force sensor.

In contrast, in the second embodiment, each of the first bridge circuit BC21, the second bridge circuit BC22 and the third bridge circuit BC23 are formed as the closed circuit completed on the base member 221, such that the connection between the base member 221 and the signal processing unit via the terminals $T_{21}$ to $T_{28}$ is merely a junction for connecting the first bridge circuit BC21, the second bridge circuit BC22 and the third bridge circuit BC23 to the power source and the calculating unit. Therefore, in the second embodiment, the junction resistances are allowed to occur in the junction parts between the terminals $T_{21}$ to $T_{28}$ and the lead wires $L_{21}$ to $L_{28}$, thereby making it possible to adopt any other methods which is different from the soldering junction, such as for example the junction using an anisotropic conductive film. Note that by using the anisotropic conductive film, it is possible to suppress the size of electrodes, the pitch between the electrodes, and the thickness of the junction parts to be about 10% (one-tenth) of those of the soldering junction, respectively. Therefore, in a case that the downsizing of the triaxial force sensor 2000 is desired, the junction using the anisotropic conductive film is advantageous.

The effects brought about by the triaxial force sensor 2000 and the strain gage 220 of the second embodiment are as follows.

In the strain gage 220 of the second embodiment, the fixed resistance elements $RX_{21}$ and $RX_{22}$ of the first bridge circuit BC21 and the fixed resistance elements $RY_{21}$ and $RY_{22}$ of the second bridge circuit BC22 are formed on the base member 221, thereby making it possible to realize the effects described about in Items (2-2) and (2-3). Furthermore, since the fixed resistance elements $RX_{21}$, $RX_{22}$, $RY_{21}$, and $RY_{22}$ are formed of the same material as the material forming the strain sensitive elements $X_{21}$, $X_{22}$, $Y_{21}$, and $Y_{22}$, it is possible to realize the effect described about in Item (2-1).

In the strain gage 220 of the second embodiment, the sensitive area 221s is formed with only the strain sensitive elements $X_{21}$, $X_{22}$, $Y_{21}$, $Y_{22}$, $Z_{21}$, and $Z_{22}$, whereas the terminals $T_{21}$ to $T_{28}$ and the fixed resistance elements $RX_{21}$, $RX_{22}$, $RY_{21}$, and $RY_{22}$ are formed in the non-sensitive areas 221n1 and 221n2. Therefore, it is possible to make the diameter (size) of the sensitive area 221s to be downsized or small, and consequently to make the flexure plate 211 of the triaxial force sensor 2000 to be small. Downsizing the flexure plate 211 leads to downsizing the triaxial force sensor 2000, which is preferred.

In the strain gage 220 of the second embodiment, since the electrodes $T_{21}$ to $T_{28}$ are provided in the non-sensitive areas 221n1 and 221n2, it is possible to increase the sizes of the electrodes $T_{21}$ to $T_{28}$ as necessary, without making the diameter of the sensitive area 221s to be great, thereby making it possible to easily carry out an operation for junction with respect to the lead wires, etc.

Since the base member 221 of the strain gage 220 of the second embodiment has, between the sensitive area 221s and the non-sensitive areas 221n1 and 221n2, the connecting areas 221c1 and 221c2 each having the width narrower than those of the sensitive area 221s and the non-sensitive areas 221n1 and 221n2, it is possible to arrange the sensitive area 221s and the non-sensitive areas 221n1 and 221n2 in a variety of kinds of aspects, without being restricted (regulated) by the connecting parts thereof with respect to the connecting parts 221c1 and 221c2.

The triaxial force sensor 2000 of the second embodiment is provided with the strain gage 220, and thus can achieve the similar effects as the strain gage 220.

With respect to the second embodiment described above, it is also possible to adopt modifications descried in the following.

In the strain gage 220, the strain sensitive elements $Z_{21}$ and $Z_{22}$ may be formed in the non-sensitive area 221n1 and/or non-sensitive area 221n2. In this case, since no flexure is generated in the non-sensitive areas 221n1 and 221n2, the strain sensitive elements $Z_{21}$ and $Z_{22}$ function substantially as fixed resistance elements (third-direction fixed resistance elements).

Even in a case that the strain sensitive elements $Z_{21}$ and $Z_{22}$ function as the fixed resistance elements, it is also possible to detect the load in the direction X with the first bridge circuit BC21 and detect the load in the direction Y with the second bridge circuit BC22, in a similar manner as in the above-described second embodiment. Further, it is also possible to detect the load in the direction Z. The reason for this is since, in a case that the load in the direction Z acts on the load receiving part 212 so as to generate the change in the resistance values of the strain sensitive elements $X_{21}$, $X_{22}$, $Y_{21}$, and $Y_{22}$, then this changes each of the combined resistance of the first bridge circuit BC21 and the combined resistance of the second bridge circuit BC22, which in turn also changes the balance of the resistance values between the elements of the third bridge circuit BC23 even if the resistance values of the strain sensitive elements $Z_{21}$ and $Z_{22}$ are constant.

It is allowable that the strain gage 220 does not have the strain sensitive elements $Z_{21}$ and $Z_{22}$. In such a case, for example, the first bridge circuit BC21 and the second bridge circuit BC22 are connected with two arc-like wires W2, rather than being connected with the strain sensitive elements $Z_{21}$ and $Z_{22}$.

Even in a case that the strain sensitive elements $Z_{21}$ and $Z_{22}$ are not provided or are omitted, it is also possible to detect the load in the direction X with the first bridge circuit BC21 and to detect the load in the direction Y with the second bridge circuit BC22, in a similar manner as in the above-described second embodiment. A strain gage 220 in such a modification can be used in a biaxial force sensor. Alternatively, it is also possible to link the first Wheatstone bridge circuit and the second Wheatstone bridge circuit, which are possessed by such a strain gage as in the modification, with the fixed resistance elements formed in the signal processing unit, to thereby construct a third Wheatstone bridge circuit so that the strain gage in this modification is usable in a triaxial force sensor.

In the strain gage 220, with respect to the fixed resistance elements $RX_{21}$, $RX_{22}$, $RY_{21}$ and $RY_{22}$ formed in the non-sensitive areas 221n1 and 221n2 of the base member 221, it is allowable to allow at least one of these elements to remain on the base member 221, and to provide the remainder of these elements on the outside of the base member 221, for example, on the signal processing unit. Also in such an aspect, by providing at least one of the fixed resistance elements $RX_{21}$ and $RX_{22}$ constructing the first bridge circuit BC11 and the fixed resistance elements $RY_{21}$ and $RY_{22}$ constructing the second bridge circuit BC22 in the non-sensitive area 221n1 and/or the non-sensitive area 221n2 on the base member 221, it is possible to realize the effect of suppressing the occurrence of the temperature error in the strain gage 220 and the triaxial force sensor 2000.

In the non-sensitive area 221n1 provided on one side in the direction y (the second direction) of the sensitive area 221s, the fixed resistance elements $RX_{21}$ and $RX_{22}$ and the terminals $T_{21}$ to $T_{24}$ may be aligned in a row or array along the direction x (the first direction) orthogonal to the direction y (the second direction). In the non-sensitive area 221n2 provided on the other side in the direction y (the second direction) of the sensitive area 221s, the fixed resistance elements $RY_{21}$ and $RY_{22}$ and the terminals $T_{25}$ to $T_{28}$ may also be aligned in a row along the direction x (the first direction) orthogonal to the direction y (the second direction). With this, it is possible to attach the non-sensitive areas 221n1 and 221n2 to a narrower part or portion; for example, it is possible to omit the holding plates 213 of the main body part 210, and to attach the non-sensitive areas 221n1 and 221n2 only to the lateral surface of the flexure plate 211.

Figure 9:
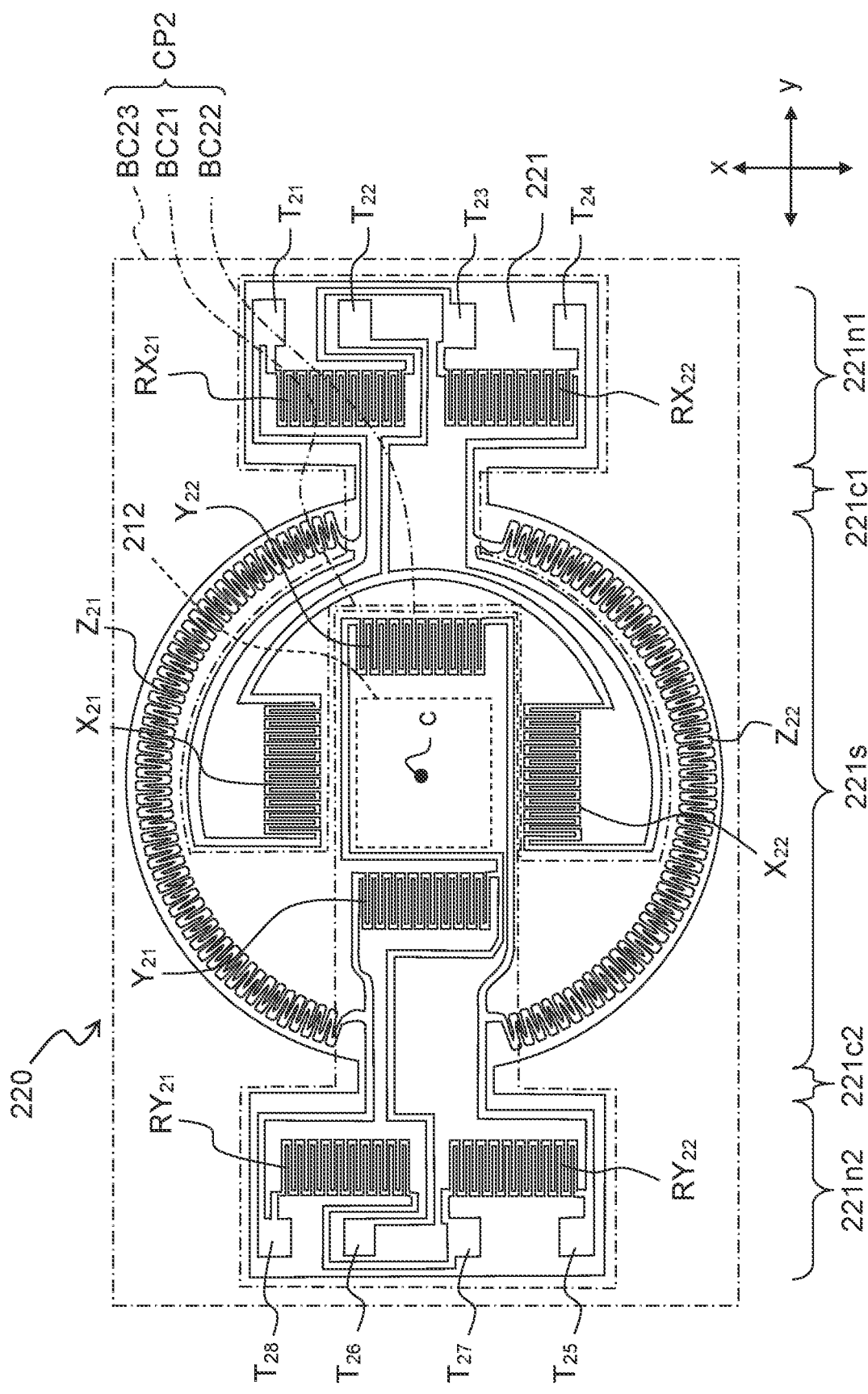
FIG. 9 depicts another example of wiring pattern of the strain gage according to the second embodiment.

As shown in FIG. 9, the fixed resistance elements $RX_{21}$ and $RX_{22}$ may be formed in a part, of the non-sensitive area 221n1, which is close to the sensitive area 221s, whereas the terminals $T_{21}$ to $T_{24}$ may be formed in a part, of the non-sensitive area 221n1, which is far from the sensitive area 221s. Namely, in the non-sensitive area 221n1, the terminals $T_{21}$ to $T_{24}$ may be arranged on an opposite side of the fixed resistance elements $RX_{21}$ and $RX_{22}$ from the sensitive area 221s. This is similarly applicable also to the arrangement of the fixed resistance elements $RY_{21}$ and $RY_{22}$ and the terminals $T_{25}$ to $T_{28}$ in the non-sensitive area 221n2. By arranging the terminals $T_{21}$ to $T_{28}$ on the outside in this manner, the lead wires, etc., can be joined to the terminals $T_{21}$ to $T_{28}$ more easily.

Any one or more of the terminals $T_{21}$ to $T_{28}$ may be formed in the sensitive area 221s. In this case, it is desirable to provide any one or more of the terminals $T_{21}$ to $T_{28}$ in the vicinity of the center c in which any one or more of the terminals $T_{21}$ to $T_{28}$ is/are attached at a location below or under the load receiving part 212 and in which any strain is less likely to be generated.

In the sensitive area 221s, the strain sensitive elements $Z_{21}$ and $Z_{22}$ may be arranged on the side of the center c (on the inner side) of the strain sensitive elements $X_{21}, X_{22}, Y_{21},$ and $Y_{22}$. Further, the strain sensitive elements $X_{21}, X_{22}, Y_{21},$ and $Y_{22}$ may be each formed into an arc-like shape such that the width direction of the grid thereof may be the circumferential direction of the sensitive area 221s. Such a strain gage 220 can be attached to the main body part 210 in which the load receiving 212 has a cylindrical shape with the rotating axis A2 as the center thereof, and can be used satisfactorily.

It is allowable that the base member 221 of the strain gage 220 has any shape such as a rectangular or elliptical shape not having the connecting areas 211c1 and 211c2, and that the base member 221 has only either one of the non-sensitive areas 221n1 and 221n2. In the base member 221 only having either one of the non-sensitive areas 221n1 and 221n2, it is allowable to form all of the fixed resistance elements $RX_{21}$, $RX_{22}$, $RY_{21}$, and $RY_{22}$ and the terminals $T_{21}$ to $T_{28}$ in that non-sensitive area which is either one of the non-sensitive areas 221n1 and 221n2. Other than those described above, the base member 221 may have any shape including the sensitive area to be attached to the flexure plate of the multiaxial force sensor, and the non-sensitive area to be arranged outside of that area.

The holding plates 213 of the main body part 210 may be flat plates extending parallel to the flexure plate 211 from the outer circumference of the flexure plate 211. In this case, the base member 221 of the strain gage 220 may be attached to the flexure plate 211 and the holding plates 213, without being bent or folded. Further, it is allowable that the main body part 210 does not have the holding plates 213. In this case, the entire areas of the non-sensitive areas 221n1 and 221n2 may be attached to the lateral surface 211c of the flexure plate 211. Other than those described above, it is allowable that the non-sensitive areas 221n1 and 221n2 are not attached to the lateral surface 211c of the flexure plate 211, or that the non-sensitive areas 221n1 and 221n2 are not attached to the main body part 210. The arrangement of the non-sensitive areas 221n1 and 221n2 in a state that the sensitive area 211s is attached to the back surface 211b of the flexure plate 211 may be determined as appropriate, depending on the shape of the main body part of the multiaxial force sensor and/or the application or usage of the multi-axis force sensor.

The strain gage 220 of the above-described second embodiment can also be used in a flexure member of any other sensor which is different from the multi-axis force sensor.

Third Embodiment

An explanation will be made on a third embodiment of the strain gage and the triaxial force sensor of the present invention, with a case in which they are applied to an electronic pen as examples thereof, with reference to FIGS. 10 to 14 mainly.

Figure 10:
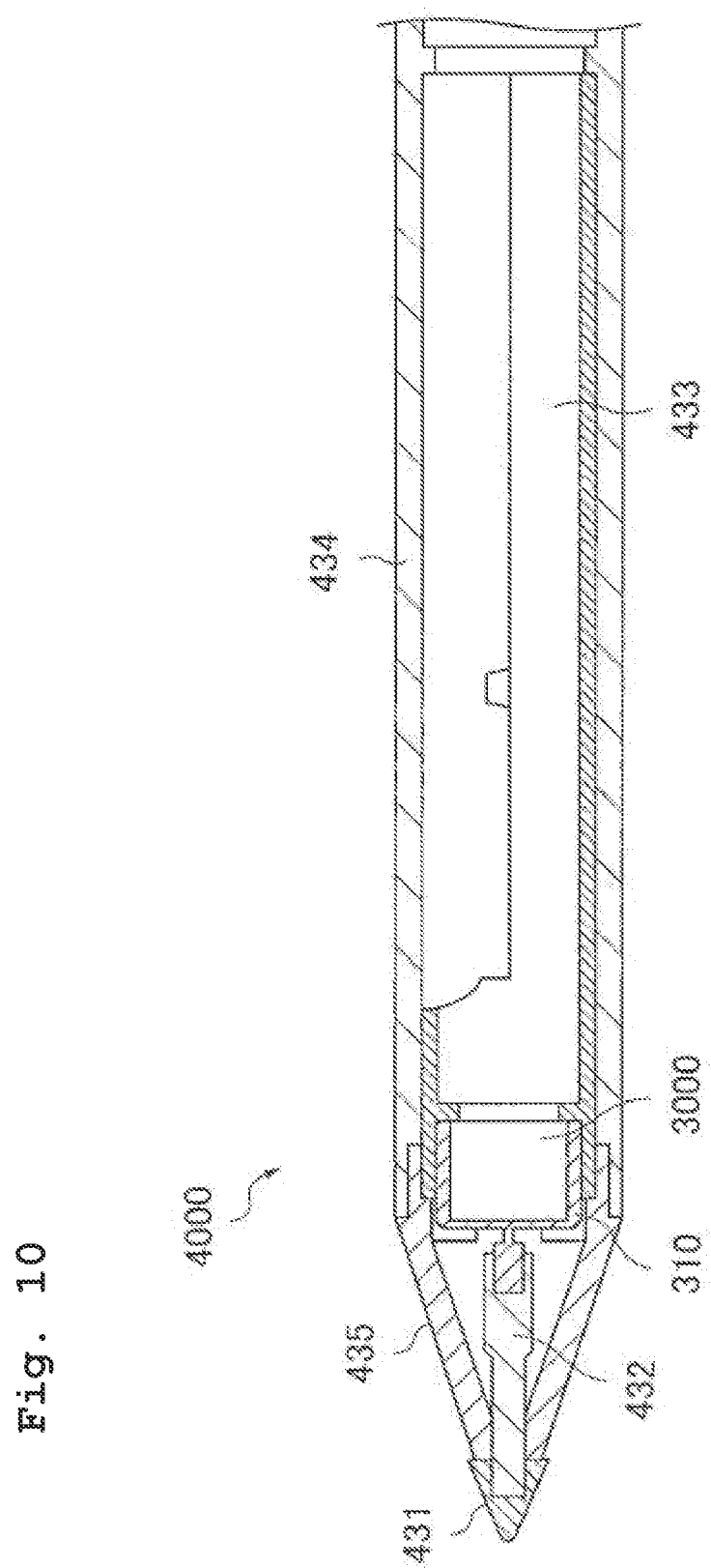
FIG. 10 is a cross-sectional view of an electronic pen having applied thereto a triaxial force sensor according to a third embodiment of the present invention.

As shown in FIG. 10, an electronic pen 4000 includes tips 431 and 432, a triaxial force sensor 3000, a holder 433, a body 434, and a front cap 435.

The tip 431 is made from, for example, plastic and functions as a nib (a tip of the pen). The tip 432 is formed from, for example, SUS. One end of the tip 432 is connected to the tip 431 and the other end is connected to the triaxial force sensor 3000. In that configuration, a load from outside applied via the tip of the pen is measured by the triaxial force sensor 3000.

The holder 433 holds not only a signal processing circuit and a power source required for an operation of the triaxial force sensor 3000 but also a Printed Circuit Board Assembly (PCBA) on which a variety of circuits are mounted. The body 434 covers part of the triaxial force sensor 3000 and the holder 433. The front cap 435 covers the remaining part of the triaxial force sensor 3000 and the tip 432.

Figure 11:
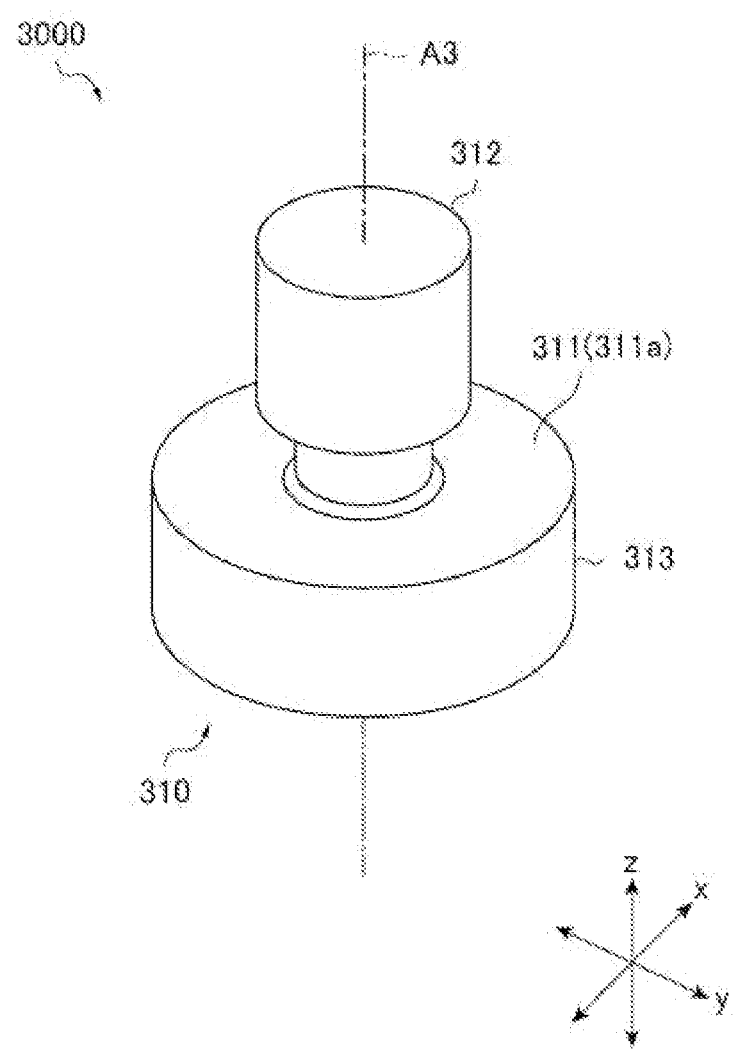
FIG. 11 is a perspective view of the triaxial force sensor according to the third embodiment of the present invention.
Figure 12:
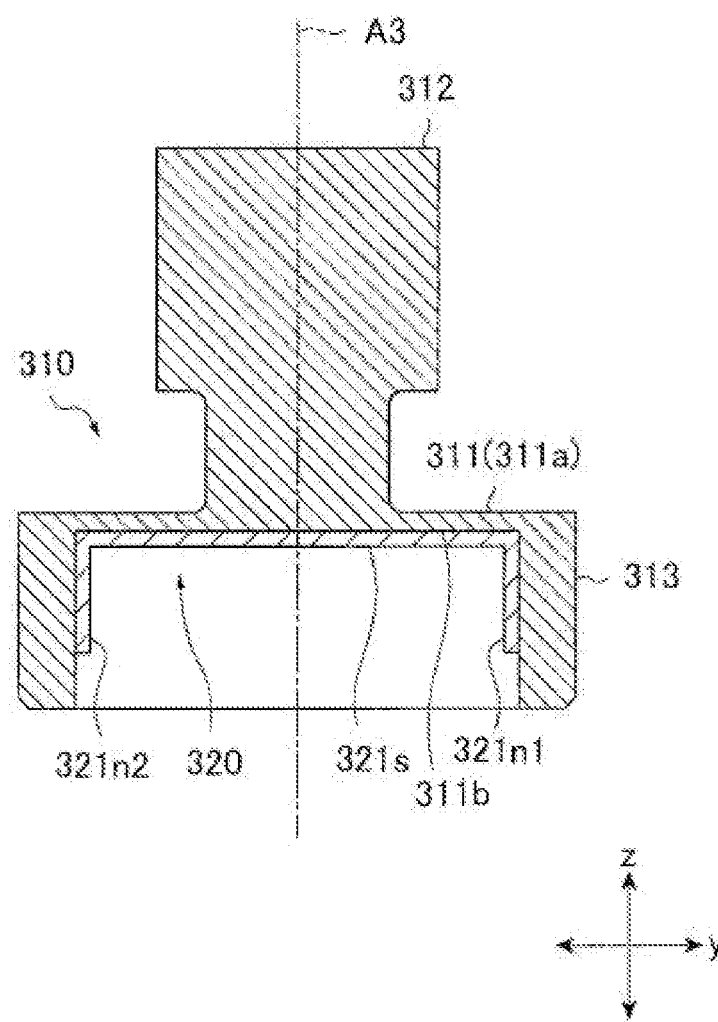
FIG. 12 is a cross-sectional view of the triaxial force sensor depicted in FIG. 11 taken along a y-z plane including an axis A3.

Subsequently, as shown in FIGS. 11 and 12, the triaxial force sensor 3000 of the third embodiment has a main body part 310 rotationally symmetrical about an axis A3. The main body part 310 includes a flexure plate (plate-shaped flexure member) 311 which has a disc-shape and of which rotating axis is the axis A3; a load receiving part 312 upstanding, in an axis direction of the rotating axis, from a central part of a surface 311a of the flexure plate 311; and a peripheral wall 313 upstanding, in the axis direction of the rotating axis, from a peripheral edge part of a back surface 311b of the flexure plate 311. The load receiving part 312 is fitted into the tip 432 as shown in FIG. 10. The main body part 310 is formed, for example, integrally with a synthetic resin material.

In the explanation of the third embodiment, as shown in FIG. 11, two radial directions orthogonal to each other in the flexure plate 311 are referred to as a direction x (first direction) and a direction y (second direction), respectively, of the triaxial force sensor 3000 and the main body part 310. Further, a direction of the axis A3 orthogonal to the direction x and the direction y is referred to as a direction z (third direction) of the triaxial force sensor 3000 and the main body part 310.

The flexure plate 311 is a disc which is strained (distorted) in a case of receiving, via the load receiving part (load applied part) 312, a load applied from outside onto the triaxial force sensor 3000. The strain in the flexure plate 311 is generated or arises on the front surface 311a and the back surface 311b of the flexure plate 311 (in FIG. 11, upper and lower surfaces orthogonal to the axis A3), but does not arise or is small enough to be neglectable on the peripheral wall 313 (the peripheral or circumferential surface parallel to the axis A3 in FIG. 11). As described above, in this specification, the term "flexure area" is used to refer to an area which is strained by receiving an external load in the flexure plate 311, such as the front surface 311a and the back surface 311b of the flexure plate 311 in the third embodiment. The diameter and the thickness of the flexure plate 311 are arbitrary.

The load receiving part 312 receives a load from outside and thereby moves so as to generate a strain in the flexure plate 311. The load receiving part 312 is provided on the front surface 311a of the flexure plate 311 such that its central axis is coincident with the rotating axis (axis A3) of the flexure plate 311, namely coaxially with the flexure plate 311.

The peripheral wall 313 upstands from the back surface 311b of the flexure plate 311 along the outer circumference of the back surface 311b, and surrounds the back surface 311b. Although FIG. 11 illustrates a case in which an outer circumferential surface of the peripheral wall 313 is cylindrical, the peripheral wall 313 may be changed as follows. Namely, at one side or both sides in an x-axis direction of the peripheral wall 313, a planar part intersecting with (orthogonal to) the x-axis may be formed in the outer circumferential surface of the peripheral wall 313. Or, at one side or both sides in a y-axis direction of the peripheral wall 313, a planar part intersecting with (orthogonal to) the y-axis may be formed in the outer circumferential surface of the peripheral wall 313.

Especially, when the planar part is provided only at one side in the x-axis direction of the peripheral wall 313, the planar part can be provided only at one side in the y-axis direction of the peripheral wall 313 as well. In that case, two planar parts are provided for the outer circumferential surface of the peripheral wall 313. When the planar parts are provided at both sides in the x-axis direction of the peripheral wall 313, the planar parts can be provided at both sides in the y-axis direction of the peripheral wall 313 as well. In that case, four planar parts are provided for the outer circumferential surface of the peripheral wall 313.

The planar part(s) provided for the outer circumferential surface of the peripheral wall 313 as described above make(s) it possible to easily and reliably position (align) the main body part 310 (i.e., triaxial force sensor 3000) with respect to the holder 433 of the electric pen 4000, taking advantage of the planer part(s). The main body part 310 may be positioned (aligned) with respect to the holder 433 by providing an alignment mark in the peripheral wall 313 of which outer circumferential surface is cylindrical as in FIG. 11.

In a strain gage 320 according to the third embodiment, part (sensitive area 321s) of a base member 321 (see FIG. 13) is attached or adhered to the back surface 311b of the flexure plate 311, and remaining parts (non-sensitive areas 321n1, 321n2) are bent and attached to an inner circumferential surface of the peripheral wall 313.

Figure 13:
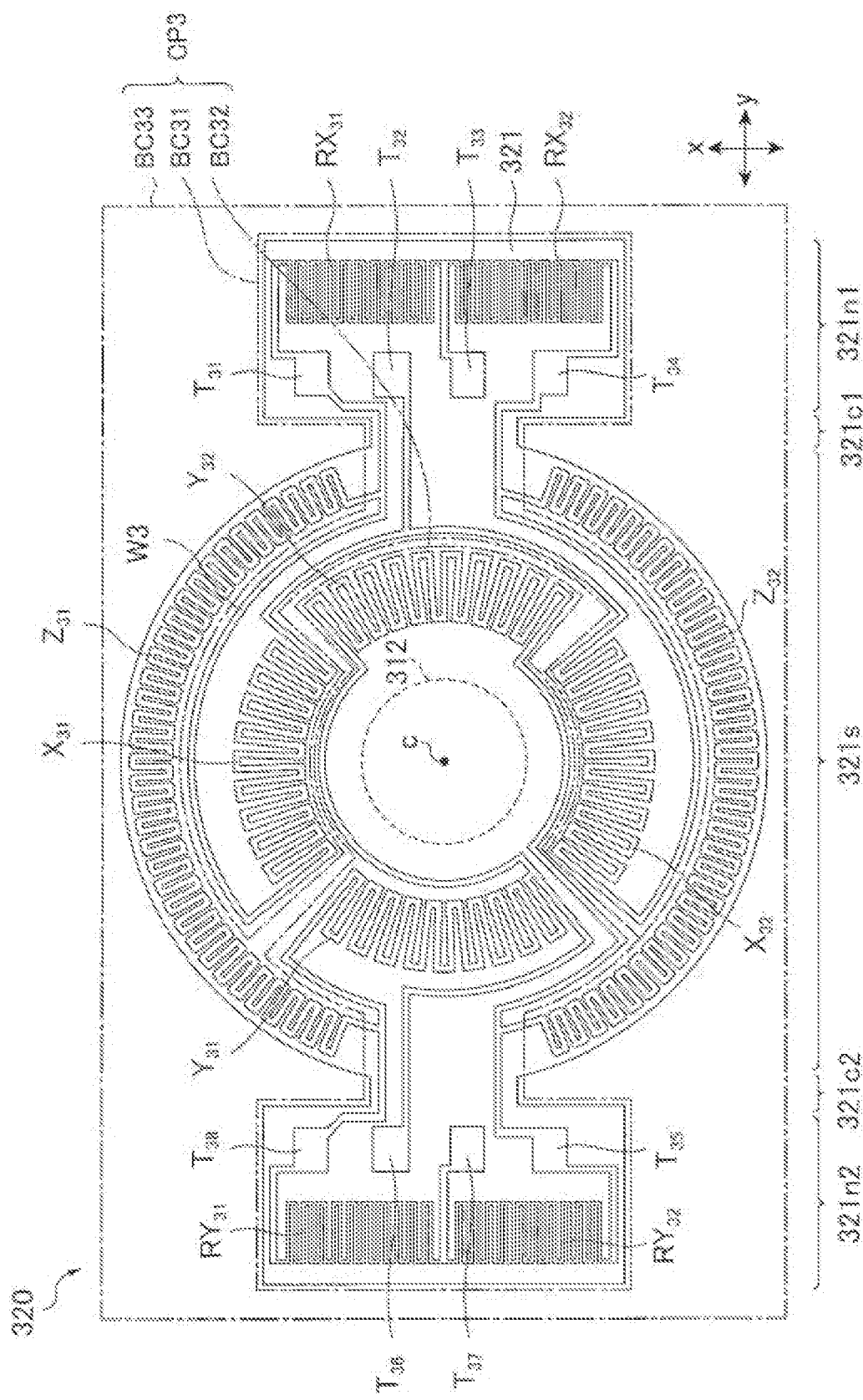
FIG. 13 depicts a wiring pattern of a strain gage according to the third embodiment of the present invention.

FIG. 13 shows a state before the strain gage 320 is provided on or attached to the flexure plate 311 (an expansion or development view). As shown in FIG. 13, the strain gage 320 includes the base member 321 and a circuit pattern CP3 printed on a surface of the base member 321. The base member 321 has the sensitive area 321s, and the non-sensitive areas 321n1 and 321n2 interposing or sandwiching the sensitive area 321s therebetween. The circuit pattern CP3 includes six strain sensitive elements $X_{31}$, $X_{32}$, $Y_{31}$, $Y_{32}$, $Z_{31}$, and $Z_{32}$, four fixed resistance elements $RX_{31}$, $RX_{32}$, $RY_{31}$, and $RY_{32}$, eight terminals $T_{31}$ to $T_{38}$, and a wire W3 connecting those members. Note that in the following explanation, a direction y (second direction) refers to a direction in which the non-sensitive areas 321n1 and 321n2 sandwich the sensitive area 321s therebetween, whereas a direction x (first direction) refers to a direction orthogonal to the direction y on the surface of the base member 321.

The base member 321 is a flexible resin film and has the sensitive area 321s which is circular and which is arranged in the center of the base member 321, a pair of non-sensitive areas 321n1 and 321n2 sandwiching the sensitive area 321s therebetween, and a pair of connecting areas 321c1 and 321c2 which connect or join the pair of non-sensitive areas 321n1 and 321n2 to the sensitive area 321s, respectively. It is preferred that the resin film used is a resin film which is highly flexible and bendable so that the resin film is easily foldable and bendable; specific examples of the usable resin film include polyester, polyimide, etc. Further, although it is also possible to form the sensitive area 321s, the non-sensitive areas 321n1 and 321n2, and the connecting areas 321c1 and 321c2 with mutually different materials, it is desirable to form those members with a same material such that the temperature property (temperature coefficient of resistance, etc.) is uniform across all the areas. Further, in such a case, it is also desirable to form the base member 321 by integrally cutting out the sensitive area 321s, the non-sensitive areas 321n1 and 321n2, and the connecting areas 321c1 and 321c2 from vicinal parts of an integrally formed material (for example, a sheet of polyester, polyimide, etc.). By virtue of this, it is possible to further uniformize the temperature properties of the respective areas.

Since the sensitive area 321s is an area to be attached or adhered to the back surface 311b of the flexure plate 311 of the main body part 310, the sensitive area 321s has a diameter equivalent to or smaller than that of the back surface 311b of the flexure plate 311. On one surface of the sensitive area 321s, there are formed the strain sensitive elements $X_{31}$ and $X_{32}$ (first-direction strain sensitive elements) with a center c being sandwiched therebetween in the direction x, the strain sensitive elements $Y_{31}$ and $Y_{32}$ (second-direction strain sensitive elements) with the center c being sandwiched therebetween in the direction y, and the strain sensitive elements $Z_{31}$ and $Z_{32}$ (third-direction strain sensitive elements) along the outer circumference.

The strain sensitive elements $X_{31}$ and $X_{32}$ have arc-like shapes respectively and are formed to face each other in the direction x, in a state that the width direction of grid thereof is consistent with the circumferential direction that is along the outline of the load receiving part 312 indicated by a dotted line in FIG. 13. The strain sensitive elements $X_{31}$ and $X_{32}$ are formed at positions equidistant from the center c respectively (a distance between the center c and the strain sensitive element $X_{31}$ and the distance between the center c and the strain sensitive element $X_{32}$ are identical).

The strain sensitive elements $Y_{31}$ and $Y_{32}$ have arc-like shapes respectively and are formed to face each other in the direction y, in a state that the width direction of grid thereof is consistent with the circumferential direction that is along the outline of the load applying unit 312. The strain sensitive elements $Y_{31}$ and $Y_{32}$ are formed at positions equidistant from the center c respectively (a distance between the center c and the strain sensitive element $Y_{31}$ and the distance between the center c and the strain sensitive element $Y_{32}$ are identical).

The strain sensitive elements $Z_{31}$ and $Z_{32}$ have arc-like shapes respectively and are formed to face each other in the direction x, in a state that the width direction of grid thereof is consistent with the circumferential direction of the sensitive area 321s. The strain sensitive elements $Z_{31}$ and $Z_{32}$ are arranged on an opposite side of the strain sensitive elements $X_{31}$, $X_{32}$, $Y_{31}$, and $Y_{32}$ from the center c (outside of the strain sensitive elements $X_{31}$, $X_{32}$, $Y_{31}$, and $Y_{32}$).

The pair of non-sensitive areas 321n1 and 321n2 are shaped to interpose the sensitive area 321s in the direction y. Each of the pair of non-sensitive areas 321n1 and 321n2 has a rectangular shape in which the direction x is the long side direction and the direction y is the short side direction.

Fixed resistance elements $RX_{31}$ and $RX_{32}$ (first-direction fixed resistance elements) are formed in an area (a part) of the surface of the non-sensitive area 321n1, which is far from the sensitive area 321s, so that each of the fixed resistance elements $RX_{31}$ and $RX_{32}$ extends in the direction x and that the fixed resistance elements $RX_{31}$ and $RX_{32}$ are aligned in the direction x; on the other hand, four terminals $T_{31}$, $T_{32}$, $T_{33}$, and $T_{34}$ are formed in an area (a part), of the surface of the non-sensitive area 321n1, which is close to the sensitive area 321s, so that the terminals $T_{31}$, $T_{32}$, $T_{33}$ and $T_{34}$ are aligned in the direction x. Namely, in the non-sensitive area 321n1, the fixed resistance elements $RX_{31}$ and $RX_{32}$ are arranged on an opposite side of the terminals $T_{31}$ to $T_{34}$ from the sensitive area 321s.

Similarly, fixed resistance elements $RY_{31}$ and $RY_{32}$ (second-direction fixed resistance elements) are formed in an area (a part), of the surface of the non-sensitive area 321n2, which is far from the sensitive area 321s, so that each of the fixed resistance elements $RY_{31}$ and $RY_{32}$ extends in the direction x and that the fixed resistance elements $RY_{31}$ and $RY_{32}$ are aligned in the direction x; on the other hand, four terminals $T_{35}$, $T_{36}$, $T_{37}$, and $T_{38}$ are formed in an area (a part), of the surface of the non-sensitive area 321n2, which is close to the sensitive area 321s, so that the terminals $T_{35}$, $T_{36}$, $T_{37}$ and $T_{38}$ are aligned in the direction x. Namely, in the non-sensitive area 321n2, the fixed resistance elements $RY_{31}$ and $RY_{32}$ are arranged on an opposite side of the terminals $T_{35}$ to $T_{38}$ from the sensitive area 321s.

The connecting areas 321c1 and 321c2 connecting the non-sensitive areas 321n1 and 321n2 to the sensitive area 321s, respectively, each have a size (width) in the direction x (orthogonal direction), orthogonal to the direction y in which the non-sensitive areas 321n1 and 321n2 are connected to the sensitive area 321s, which is smaller than a size (width) in the direction x of each of the sensitive area 321s and the non-sensitive areas 321n1 and 321n2. Accordingly, the base member 321 has a shape which is constricted at the connecting areas 321c1 and 321c2.

Figure 14:
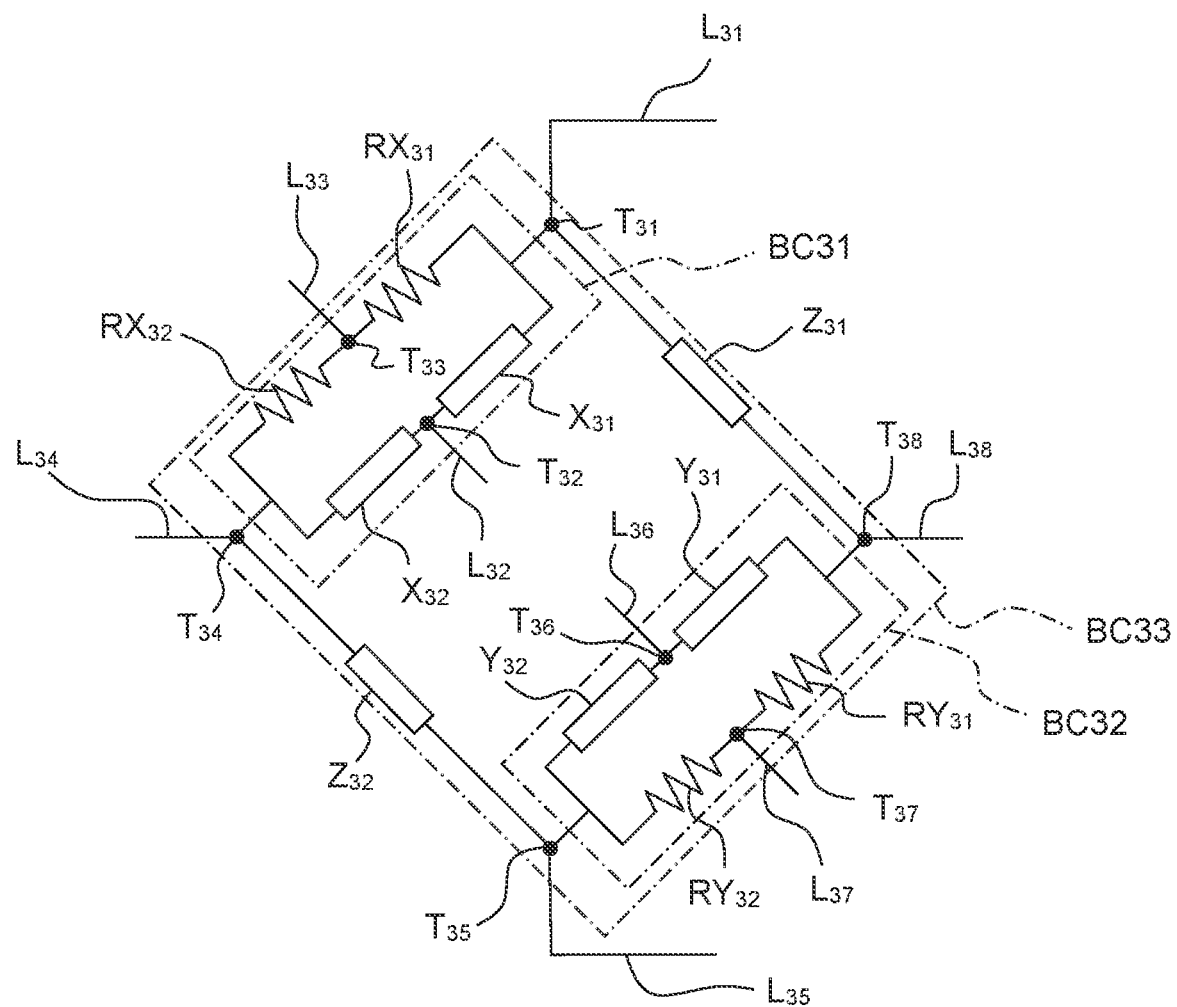
FIG. 14 is a circuit diagram corresponding to the wiring pattern of the strain gage depicted in FIG. 13.

As shown in FIGS. 13 and 14, the wire W3 connects the strain sensitive elements $X_{31}$ and $X_{32}$ and the fixed resistance elements $RX_{31}$ and $RX_{32}$ to construct a first bridge circuit BC31 (first Wheatstone bridge circuit). Further, the terminal $T_{31}$ is connected between the strain sensitive element $X_{31}$ and the fixed resistance element $RX_{31}$, the terminal $T_{32}$ is connected between the strain sensitive elements $X_{31}$ and $X_{32}$, the terminal $T_{33}$ is connected between the fixed resistance elements $RX_{31}$ and $RX_{32}$, and the terminal $T_{34}$ is connected between the strain sensitive element $X_{32}$ and the fixed resistance element $RX_{32}$.

Similarly, the wire W3 connects the strain sensitive elements $Y_{31}$ and $Y_{32}$ and the fixed resistance elements $RY_{31}$ and $RY_{32}$ to construct a second bridge circuit BC32 (second Wheatstone bridge circuit). Further, the terminal $T_{38}$ is connected between the strain sensitive element $Y_{31}$ and the fixed resistance element $RY_{31}$, the terminal $T_{36}$ is connected between the strain sensitive elements $Y_{31}$ and $Y_{32}$, the terminal $T_{37}$ is connected between the fixed resistance elements $RY_{31}$ and $RY_{32}$, and the terminal $T_{35}$ is connected between the strain sensitive element $Y_{32}$ and the fixed resistance element $RY_{32}$.

One end of the strain sensitive element $Z_{31}$ is connected to the first bridge circuit BC31 between the strain sensitive element $X_{31}$ and the fixed resistance element $RX_{31}$, whereas the other end of the strain sensitive element $Z_{31}$ is connected to the second bridge circuit BC32 between the strain sensitive element $Y_{31}$ and the fixed resistance element $RY_{31}$. Similarly, one end of the strain sensitive element $Z_{32}$ is connected to the first bridge circuit BC31 between the strain sensitive element $X_{32}$ and the fixed resistance element $RX_{32}$, whereas the other end of the strain sensitive element $Z_{32}$ is connected to the second bridge circuit BC32 between the strain sensitive element $Y_{32}$ and the fixed resistance element $RY_{32}$. By virtue of this, a third bridge circuit BC33 (third Wheatstone bridge circuit) is constructed with the first bridge circuit BC31 and the second bridge circuit BC32 on one pair of opposite sides respectively, and with the strain sensitive elements $Z_{31}$ and $Z_{32}$ on the other pair of opposite sides respectively.

The strain sensitive elements $X_{31}$, $X_{32}$, $Y_{31}$, $Y_{32}$, $Z_{31}$, and $Z_{32}$ and the fixed resistance elements $RX_{31}$, $RX_{32}$, $RY_{31}$, and $RY_{32}$ and the wire W3 included in the circuit pattern CP3 are formed from the same material, or preferably formed from vicinal parts in one material. This material is, for example, copper, a copper alloy such as copper nickel or the like, etc. It is possible to carry out the print of the circuit pattern CP3 on the base member 321 by way of photoetching, printing, evaporation, sputtering, etc.

As shown in FIG. 12, the strain gage 320 is attached to the main body part 310 such that the surface of the base member 321 on a side opposite to the surface of the base member 321 formed with the circuit pattern CP3 may be in contact with the back surface 311b of the main body part 310.

Specifically, the sensitive area 321s of the base member 321 is attached to the back surface 311b of the flexure plate 311 such that the direction x and the direction y of the base member 321 are coincident with the direction x and the direction y of the main body part 310, respectively, and that the center c is coincident with the axis A3. Namely, the sensitive area 321s is attached to the flexure area of the flexure plate 311 where a strain arises in a case of receiving the load. Therefore, in a state that the sensitive area 321s of the base member 321 is attached to the flexure plate 311, the strain sensitive elements $X_{31}$ and $X_{32}$ and the strain sensitive elements $Y_{31}$ and $Y_{32}$ are arranged in areas which are arranged on the outside of the load receiving part 312 in the direction x and/or the direction y and in each of which a comparatively large strain is generated.

The pair of non-sensitive areas 321n1 and 321n2 of the base member 321 are folded or bent and attached to the inner circumferential surface of the peripheral wall 313. Namely, the non-sensitive areas 321n1 and 321n2 are provided on the outside of the flexure area. Accordingly, the terminals $T_{31}$, $T_{32}$, $T_{33}$, and $T_{34}$ formed in the non-sensitive area 321n1 and the terminals $T_{35}$, $T_{36}$, $T_{37}$, and $T_{38}$ formed in the non-sensitive area 321n2 are exposed to the inside of the peripheral wall 313, while facing or being oriented toward the inside in the radial direction of the peripheral wall 313.

Next, an explanation will be made on a method for using the triaxial force sensor 3000 and the strain gage 320 according to the third embodiment, and an operation thereof.

In a case that the triaxial force sensor 3000 is used in the electronic pen 4000, the load receiving part 312 is first fitted in the nib (the tip of the pen, i.e., the tip 432). Next, the terminals $T_{31}$ to $T_{38}$ are connected respectively to a signal processing circuit (not shown) by using lead wires $L_{31}$ to $L_{38}$. It is possible to connect the terminal $T_{31}$ to $T_{38}$ and the lead wires $L_{31}$ to $L_{38}$ by an arbitrary method. For example, it is possible to use a solder or an anisotropic conductive film (ACF) therefor.

The terminals $T_{31}$ and $T_{35}$ are connected, with the lead wires $L_{31}$ and $L_{38}$, respectively, to the power source (not shown). The terminals $T_{32}$ and $T_{33}$, the terminals $T_{36}$ and $T_{37}$ and the terminals $T_{34}$ and $T_{38}$ are connected, with the lead wires $L_{32}$ and $L_{33}$, the lead wires $L_{36}$ and $L_{37}$ and the lead wires $L_{34}$ and $L_{38}$, respectively, to a calculating unit (not shown) in the signal processing circuit via an amplifier (not shown) in the signal processing circuit.

In a case that the triaxial force sensor 3000 is operating, an input voltage Ei is applied between the terminal $T_{31}$ and the terminal $T_{33}$ by the power source. The resistance value of each of the strain sensitive elements constructing the first bridge circuit BC31, the second bridge circuit BC32 and the third bridge circuit BC33 and the resistance value of each of the fixed resistance elements constructing the first bridge circuit BC31, the second bridge circuit BC32 and the third bridge circuit BC33 have been adjusted so that the voltages are equal or uniform between the terminals $T_{32}$ and $T_{33}$, that the voltages are equal between the terminals $T_{36}$ and $T_{37}$, and that the voltages are equal between the terminals $T_{34}$ and $T_{38}$, in a state that the sensitive area 321s of the base member 321 has no flexure.

Therefore, in a state that the flexure plate 311 has no strain and that the sensitive area 321s has no flexure as shown in FIG. 3(a), there is no difference in the potential between the terminals $T_{32}$ and $T_{33}$, between the terminals $T_{36}$ and $T_{37}$, and between the terminals $T_{34}$ and $T_{38}$, and thus the calculating unit does not calculate the strain.

Next, in a case that a load in the direction X is applied to the load receiving part 312 as shown in FIG. 3(b), the load receiving part 312 receives the load and thus moves to cause a strain to be generated in the flexure plate 311. On this occasion, the sensitive area 321s of the base member 321 of the strain gage 320 attached to the flexure plate 311 also flexes integrally with the flexure plate 311, so as to cause a compressive strain to be generated in the strain sensitive element $X_{31}$ and to cause a tensile strain (an elongation strain) to be generated in the strain sensitive element $X_{32}$.

By virtue of this, each of the resistance values of the strain sensitive elements $X_{31}$ and $X_{32}$ is changed to thereby generate a potential difference (a difference in the potential) between the terminals $T_{32}$ and $T_{33}$ of the first bridge circuit BC31 including the strain sensitive elements $X_{31}$ and $X_{32}$. Based on this potential difference, the calculating unit obtains the amount of the strain generated in the flexure plate 311 so as to obtain magnitude of the load in the direction c acting on the load receiving unit 312. Note that on this occasion, no strain is generated in the peripheral wall 313, due to which the resistance values of the fixed resistance elements $RX_{31}$ and $RX_{32}$ are constant.

Also in a case that a load in the direction y is applied to the load receiving part 312, the magnitude of the load in the direction y acting on the load receiving part 312 is obtained in a similar manner as described above.

In a case that a load in the direction z is applied to the load receiving part 312, tensile strains are generated in all the strain sensitive elements $X_{31}$, $X_{32}$, $Y_{31}$, $Y_{32}$, $Z_{31}$, and $Z_{32}$ since the flexure plate 311 and the sensitive area 321s of the base member 321 are curved such that the centers thereof are projected. By virtue of this, each of the combined resistance of the first bridge circuit BC31, the combined resistance of the second bridge circuit BC32, and the resistance values of the strain sensitive elements $Z_{31}$ and $Z_{32}$ is changed to thereby generate a potential difference between the terminals $T_{34}$ and $T_{38}$ of the third bridge circuit BC33. Based on this potential difference, the calculating unit obtains the amount of the strain generated in the flexure plate 311 so as to obtain the magnitude of the load in the direction z acting on the load receiving part 312.

Hereinbelow, an explanation will be given on the significance of printing, on the base member 321, the fixed resistance elements $RX_{31}$ and $RX_{32}$ of the first bridge circuit BC31 and the fixed resistance elements $RY_{31}$ and $RY_{32}$ of the second bridge circuit BC32 and of forming the fixed resistance elements $RX_{31}$ and $RX_{32}$ of the first bridge circuit BC31 and the fixed resistance elements $RY_{31}$ and $RY_{32}$ of the second bridge circuit BC32 with a same material as that forming the strain sensitive elements $X_{31}$, $X_{32}$, $Y_{31}$, $Y_{32}$, $Z_{31}$, and $Z_{32}$.

(3-1) By forming the fixed resistance elements $RX_{31}$, $RX_{32}$, $RY_{31}$, and $RY_{32}$ in the above-described manner, the fixed resistance elements $RX_{31}$, $RX_{32}$, $RY_{31}$ and $RY_{32}$ are formed from the same material as the strain sensitive elements $X_{31}$, $X_{32}$, $Y_{31}$, $Y_{32}$, $Z_{31}$, and $Z_{32}$, and at the positions in the vicinity thereof. Here, the temperature coefficient of resistance indicating a change ratio of the resistance value with respect to the change in the temperature (temperature change) is a physical property value depending on the material; therefore, in the third embodiment, the temperature coefficient of resistance is equal among all the strain sensitive elements and all the fixed resistance elements. Further, since the fixed resistance elements $RX_{31}$, $RX_{32}$, $RY_{31}$, and $RY_{32}$ are formed on the base member 321 and at the locations in the vicinity of the strain sensitive elements $X_{31}$, $X_{32}$, $Y_{31}$, $Y_{32}$, $Z_{31}$, and $Z_{32}$, the changes in the ambient temperature each affecting each of the strain sensitive elements and each of the fixed resistance elements are substantially the same. Therefore, in a case that any change arises in the ambient temperature, the resistance values of all the strain sensitive elements and the resistance values of all the fixed resistance elements change at a same ratio.

In each of the first bridge circuit BC31, the second bridge circuit BC32 and the third bridge circuit BC33, in a case that the balance of the resistance values changes between the resistance elements (the strain sensitive elements and the fixed resistance elements) included therein, then any potential differences arise between the terminals $T_{32}$ and $T_{33}$, between terminals $T_{36}$ and $T_{37}$, and between the terminals $T_{34}$ and $T_{38}$, based on which strains are detected. Therefore, in a case that the balance changes between the resistance values of the strain sensitive elements and the resistance values of the fixed resistance elements due to a change in ambient temperature, any measuring error might be generated due to this change in the balance. In the third embodiment, however, in a case that the ambient temperature changes, the resistance values of all the strain sensitive elements and the resistance values of all the fixed resistance elements change at the same ratio. Therefore, even in a case that the ambient temperature changes, the balance of the resistance values does not change between the respective elements, thereby suppressing the measuring error from occurring. Note that in the formation of the circuit pattern CP3, in a case that vicinal parts of the material (copper, a copper alloy, etc.) prepared as an integral block are used to form the strain sensitive elements, etc., it is possible to further make the temperature coefficients of resistance of the strain sensitive elements $X_{31}$, $X_{32}$, $Y_{31}$, $Y_{32}$, $Z_{31}$, and $Z_{32}$, the fixed resistance elements $RX_{31}$, $RX_{32}$, $RY_{31}$, and $RY_{32}$, and the wire W3 to be further uniform, thereby making it possible to more satisfactorily suppress the occurrence of the measuring error.

(3-2) As in the third embodiment, in a case that the fixed resistance elements $RX_{31}$ and $RX_{32}$ of the first bridge circuit BC31 and the fixed resistance elements $RY_{31}$ and $RY_{32}$ of the second bridge circuit BC32 are formed in the non-sensitive areas 321n1 and 321n2 of the base member 321 and that the non-sensitive areas 321n1 and 321n2 are attached or adhered to a part, of the main body part 310, at which any strain is not generated (a part on the outside of the flexure area), it is possible to thereby cause the fixed resistance elements $RX_{31}$, $RX_{32}$, $RY_{31}$, and $RY_{32}$ to function as dummy gages for the purpose of temperature compensation. Therefore, even in a case that any expansion or contraction is generated in the main body part 310 including the flexure plate 311 due to any change in the ambient temperature, it is also possible to suppress the occurrence of a measuring error by compensating the change in the resistance values of the strain sensitive elements $X_{31}$, $X_{32}$, $Y_{31}$, and $Y_{32}$ due to the expansion or the contraction.

(3-3) By printing and forming the fixed resistance elements $RX_{31}$, $RX_{32}$, $RY_{31}$, and $RY_{32}$ on the base member 321, it is possible to form each of the first bridge circuit BC31, the second bridge circuit BC32 and the third bridge circuit BC33 as closed circuits completed on the base member 321.

There is presumed such a case that the strain sensitive elements constructing a bridge circuit are printed on a base member while the fixed resistance elements constructing the bridge circuit are provided on the outside of the base member, for example, provided on the signal processing circuit; in such a case, in order to allow the bridge circuit be a closed circuit, it is necessary to connect the strain sensitive elements on the base member and the fixed resistance elements of the signal processing unit with lead wires, etc. In this case, the wires on the base member and the lead wires are connected by joining the lead wires to electrodes provided on the base member. However, in a case that junction resistances arise in the junction parts between the electrodes and the lead wires, then the junction resistances will become internal resistances of the bridge circuit to thereby cause a large error in the strain detection. Therefore, the method of junction is limited to the soldering junction in which the junction resistances are small to such an extent that the junction resistances are substantially neglectable.

However, in order to perform the soldering junctions satisfactorily, it is necessary to provide comparatively large electrodes on the base member, and to secure the pitch(es) between the electrodes. Therefore, the base member has to be large. Further, in order to perform the soldering junctions satisfactorily, it is necessary to pile up solder such that the solder has a certain level of thickness, this also hinders downsizing of the triaxial force sensor.

In view of the above situations, the third embodiment forms each of the first bridge circuit BC31, the second bridge circuit BC32 and the third bridge circuit BC33 as the closed circuit completed on the base member 321, such that the connection between the base member 321 and the signal processing unit via the terminals $T_{31}$ to $T_{38}$ is merely a junction for connecting the first bridge circuit BC31, the second bridge circuit BC32 and the third bridge circuit BC33 to the power source and the calculating unit. Therefore, in the third embodiment, the junction resistances are allowed to occur in the junction parts between the terminals $T_{31}$ to $T_{38}$ and the lead wires $L_{31}$ to $L_{38}$, thereby making it possible to adopt any other methods which is different from the soldering junction, such as for example the junction using an anisotropic conductive film. Note that by using the anisotropic conductive film, it is possible to suppress the size of electrodes, the pitch between the electrodes, and the thickness of the junction parts to be about 10% (one-tenth) of those of the soldering junction, respectively. Therefore, in a case that the downsizing of the triaxial force sensor 3000 is desired, the junction using the anisotropic conductive film is advantageous.

The effects brought about by the triaxial force sensor 3000 and the strain gage 320 of the third embodiment are as follows.

In the strain gage 320, the fixed resistance elements $RX_{31}$ and $RX_{32}$ of the first bridge circuit BC31 and the fixed resistance elements $RY_{31}$ and $RY_{32}$ of the second bridge circuit BC32 are formed on the base member 321, thereby making it possible to realize the effects described about in Items (3-2) and (3-3). Furthermore, since the fixed resistance elements $RX_{31}$, $RX_{32}$, $RY_{31}$, and $RY_{32}$ are formed of the same material as the material forming the strain sensitive elements $X_{31}$, $X_{32}$, $Y_{31}$, and $Y_{32}$, it is possible to realize the effect described about in Item (3-1).

In the strain gage 320, the sensitive area 321s is formed with only the strain sensitive elements $X_{31}$, $X_{32}$, $Y_{31}$, $Y_{32}$, $Z_{31}$, and $Z_{32}$, whereas the terminals $T_{31}$ to $T_{38}$ and the fixed resistance elements $RX_{31}$, $RX_{32}$, $RY_{31}$, and $RY_{32}$ are formed in the non-sensitive areas 321n1 and 321n2. Therefore, it is possible to make the diameter (size) of the sensitive area 321s to be downsized or small, and further to make the flexure plate 311 of the triaxial force sensor 3000 to be small. Downsizing the flexure plate 311 leads to downsizing the triaxial force sensor 3000, which is preferred.

In the strain gage 320, since the terminals $T_{31}$ to $T_{38}$ are provided in the non-sensitive areas 321n1 and 321n2, it is possible to increase the sizes of the terminals $T_{31}$ to $T_{38}$ as necessary, without making the diameter of the sensitive area 321s to be large, thereby making it possible to easily carry out an operation for junction with respect to the lead wires, etc.

Since the base member 321 of the strain gage 320 of the third embodiment has, between the sensitive area 321s and the non-sensitive areas 321n1 and 321n2, the connecting areas 321c1 and 321c2 each having the width narrower than those of the sensitive area 321s and the non-sensitive areas 321n1 and 321n2, it is possible to arrange the sensitive area 321s and the non-sensitive areas 321n1 and 321n2 in a variety of kinds of aspects, without being restricted (regulated) by the connecting parts thereof with respect to the connecting parts 321c1 and 321c2.

The triaxial force sensor 3000 and the electronic pen 4000 of the third embodiment are provided with the strain gage 320, and thus can achieve the similar effects as the strain gage 320.

The present invention is not limited to the embodiments, provided that characteristics of the present invention can be obtained. The present invention includes any other embodiments which can be conceived in the range of technical ideas of the present invention.

INDUSTRIAL APPLICABILITY

The strain gage and the multiaxial force sensor of the present invention can inhibit the effect of temperature change in load detection, and can contribute to the improvement of stability and reliability in robots, game devices, various measuring devices, and other devices.

REFERENCE SIGNS LIST 111, 211, 311: flexure plate (flexure member); 112, 212, 312: load receiving part; 120, 220, 320: strain gage; 121, 221, 321: base member; 121s, 221s, 321s: sensitive area; 121n1, 121n2, 221n1, 221n2, 321n1, 321n2: non-sensitive area; BC11, BC21, BC31: first bridge circuit (first Wheatstone bridge circuit); BC12, BC22, BC32: second bridge circuit (second Wheatstone bridge circuit); BC13, BC23, BC33: third bridge circuit (third Wheatstone bridge circuit); $RX_{11}$, $RX_{12}$, $RX_{21}$, $RX_{22}$, $RX_{31}$, $RX_{32}$: fixed resistance element (first-direction fixed resistance element); $RY_{11}$, $RY_{12}$, $RY_{21}$, $RY_{22}$, $RY_{31}$, $RY_{32}$: fixed resistance element (second-direction fixed resistance element); $T_{11}$ to $T_{18}$, $T_{21}$ to $T_{28}$, $T_{31}$ to $T_{38}$: terminal; $X_{11}$, $X_{12}$, $X_{21}$, $X_{22}$, $X_{31}$, $X_{32}$: strain sensitive element (first-direction strain sensitive element); $Y_{11}$, $Y_{12}$, $Y_{21}$, $Y_{22}$, $Y_{31}$, $Y_{32}$: strain sensitive element (second-direction strain sensitive element); $Z_{11}$, $Z_{12}$, $Z_{21}$, $Z_{22}$, $Z_{31}$, $Z_{32}$: strain sensitive element (third-direction strain sensitive element)

The invention claimed is:

1. A flexure body configured to be used in a detection of a force applied in a first direction and a detection of a force applied in a second direction different from the first direction, the flexure body comprising:
   a flexure member;
   a pair of first-direction strain sensitive elements configured to detect the force applied in the first direction;
   a first terminal electrically connected to the pair of first-direction strain sensitive elements;
   a pair of second-direction strain sensitive elements configured to detect the force applied in the second direction; and
   a second terminal electrically connected to the pair of second-direction strain sensitive elements;
   wherein the flexure member has a flexure area configured to be strained under a force from a detection object and an area different from the flexure area;
   the pair of first-direction strain sensitive elements and the pair of second-direction strain sensitive elements are formed of a same material, and are provided in the flexure area of the flexure member; and
   the first terminal and the second terminal are provided in the area different from the flexure area of the flexure member,
   the flexure body further comprising a pair of fixed resistance elements which are provided in the area different from the flexure area, and which are configured to construct a Wheatstone bridge circuit with the pair of first-direction strain sensitive elements or the pair of second-direction strain sensitive elements, the pair of fixed resistance elements, the pair of first-direction strain sensitive elements and the pair of second-direction strain sensitive elements being formed of the same material.

2. The flexure body according to claim 1, wherein, in the area different from the flexure area, the first terminal and the second terminal are provided on an opposite side of the pair of fixed resistance elements from the flexure area.

3. A sensor comprising:
   the flexure body as defined in claim 1; and
   a load receiving part connected to the flexure member.

4. A flexure body configured to be used in a detection of a force applied in a first direction and a detection of a force applied in a second direction different from the first direction, the flexure body comprising:
   a flexure member;
   a pair of first-direction strain sensitive elements configured to detect the force applied in the first direction;
   a first terminal electrically connected to the pair of first-direction strain sensitive elements;
   a pair of second-direction strain sensitive elements configured to detect the force applied in the second direction;
   a second terminal electrically connected to the pair of second-direction strain sensitive elements;
   a first wire provided on the flexure member so as to electrically connect a first one of the pair of first-direction strain sensitive electrodes and a second one of the pair of first-direction strain sensitive electrodes; and
   a second wire, different from the first wire, provided on the flexure member so as to electrically connect a first one of the pair of second-direction strain sensitive electrodes and a second one of the pair of second-direction strain sensitive electrodes,
   wherein the flexure member has a flexure area configured to be strained under a force from a detection object and an area different from the flexure area;
   the pair of first-direction strain sensitive elements and the pair of second-direction strain sensitive elements are formed of a same material, and are provided in the flexure area of the flexure member; and
   the first terminal and the second terminal are provided in the area different from the flexure area of the flexure member.

5. The flexure body according to claim 4, further comprising a pair of fixed resistance elements which are provided in the area different from the flexure area, and which are configured to construct a Wheatstone bridge circuit with the pair of first-direction strain sensitive elements or the pair of second-direction strain sensitive elements, the pair of fixed resistance elements, the pair of first-direction strain sensitive elements and the pair of second-direction strain sensitive elements being formed of the same material.

6. The flexure body according to claim 5, wherein, in the area different from the flexure area, the first terminal and the second terminal are provided on an opposite side of the pair of fixed resistance elements from the flexure area.

7. A sensor comprising:
   the flexure body as defined in claim 4; and
   a load receiving part connected to the flexure member.

8. A flexure body configured to be used in a detection of a force applied in a first direction and a detection of a force applied in a second direction different from the first direction, the flexure body comprising:
   a flexure member;
   a pair of first-direction strain sensitive elements configured to detect the force applied in the first direction;
   a pair of second-direction strain sensitive elements configured to detect the force applied in the second direction; and
   a terminal electrically connected to the pair of first-direction strain sensitive elements or the pair of second-direction strain sensitive elements;
   wherein the flexure member has a flexure area configured to be strained under a force from a detection object and an area different from the flexure area;
   the pair of first-direction strain sensitive elements and the pair of second-direction strain sensitive elements are formed of a same material, and are provided in the flexure area of the flexure member;

the terminal is provided on a center side of the flexure member with respect to the pair of first-direction strain sensitive elements and the pair of second-direction strain sensitive elements; and the area different from the flexure area is an area which is not strained in a case that the flexure area is strained, the area different from the flexure area including a first area and a second area defined such that the pair of first-direction strain sensitive elements, the pair of second-direction strain sensitive elements, and the terminal are interposed between the first area and the second area.

9. A sensor comprising:
the flexure body as defined in claim 8; and
a load receiving part connected to the flexure member.

* * * * *